(12) United States Patent
Wang et al.

(10) Patent No.: US 12,218,191 B1
(45) Date of Patent: Feb. 4, 2025

(54) SEMICONDUCTOR STRUCTURE AND MANUFACTURING METHOD THEREOF

(71) Applicant: Diodes Incorporated, Plano, TX (US)

(72) Inventors: Ching-Wen Wang, New Taipei (TW); Jie Li, New Taipei (TW); Ming-Wei Tsai, New Taipei (TW); Chiao-Shun Chuang, New Taipei (TW)

(73) Assignee: Diodes Incorporated, Plano, TX (US)

( * ) Notice: Subject to any disclaimer, the term of this patent is extended or adjusted under 35 U.S.C. 154(b) by 3 days.

(21) Appl. No.: 18/603,854

(22) Filed: Mar. 13, 2024

(30) Foreign Application Priority Data

Nov. 17, 2023 (CN) .......................... 202311543706.8

(51) Int. Cl.
| | | |
|---|---|---|
| *H01L 29/06* | (2006.01) | |
| *H01L 21/04* | (2006.01) | |
| *H01L 29/16* | (2006.01) | |

(52) U.S. Cl.
CPC ........ *H01L 29/0623* (2013.01); *H01L 21/046* (2013.01); *H01L 29/1608* (2013.01)

(58) Field of Classification Search
CPC ............. H01L 29/0623; H01L 29/0619; H01L 29/1608
See application file for complete search history.

(56) References Cited

U.S. PATENT DOCUMENTS

| | | | |
|---|---|---|---|
| 2020/0185519 A1* | 6/2020 | Hiyoshi | .............. H01L 29/0615 |
| 2021/0234038 A1* | 7/2021 | Uchida | .............. H01L 29/0619 |
| 2023/0170383 A1* | 6/2023 | Kim | ................. H01L 29/66712 |
| | | | 257/494 |

\* cited by examiner

*Primary Examiner* — Wasiul Haider
(74) *Attorney, Agent, or Firm* — Hong Zou; AP3 Law Firm PLLC

(57) ABSTRACT

A semiconductor structure includes a silicon carbide layer, which has a unit region and a termination region surrounding the unit region. A first guard ring structure is located in the termination region of the silicon carbide layer, and adjoins a top surface of the silicon carbide layer. The first guard ring structure may include at least one first guard ring well region. A second guard ring structure is located in the silicon carbide layer and below the first guard ring structure. The second guard ring structure may include at least one second guard ring well region, which corresponds to the at least one first guard ring well region in a vertical direction. A method for manufacturing the semiconductor structure is also provided.

20 Claims, 22 Drawing Sheets

SEMICONDUCTOR STRUCTURE AND MANUFACTURING METHOD THEREOF

CROSS-REFERENCE TO RELATED APPLICATIONS

This patent application claims priority to Chinese Patent Application No. 202311543706.8, filed on Nov. 17, 2023 and entitled "Semiconductor structure and manufacturing method thereof," which is hereby incorporated by reference herein as if reproduced in its entirety.

TECHNICAL FIELD

The present disclosure relates generally to the field of semiconductors, and in particular embodiments, to techniques and mechanisms for a semiconductor structure and a manufacturing method thereof. In some embodiments, semiconductor structures having floating guard ring terminals and methods of fabricating the same are provided.

BACKGROUND

It is well known that semiconductor materials have wide bandgap (such as a bandgap energy value Eg greater than 1.1 eV), low on-resistance (RON), high thermal conductivity, high operating frequency and high charge carrier saturation velocity, and are very suitable for production of electronic components, such as diodes or transistors, especially components for power supply applications. A material that has the above characteristics and is designed for the manufacture of electronic components is silicon carbide (SiC). In particular, in its different polytypes (e.g., 3C-SiC, 4H-SiC, 6H-SiC), silicon carbide is superior to silicon with respect to the characteristics listed previously. Compared with similar devices on silicon substrates, electronic devices on silicon carbide substrates have many advantages, such as low on-state output resistance, low leakage current, high operating temperature, high operating frequency, and so on. However, when a silicon carbide semiconductor device is operating, a high-intensity electric field will be generated at the interface between the oxide and silicon carbide, which may cause the reliability of the silicon carbide semiconductor device to decrease in the long run.

SUMMARY

Technical advantages are generally achieved, by embodiments of this disclosure which describe a semiconductor structure and a manufacturing method thereof.

Embodiments of the present disclosure relate to a semiconductor structure. The semiconductor structure includes: a silicon carbide layer divided into a unit region and a termination region surrounding the unit region, wherein the top surface of the silicon carbide layer extends in a horizontal direction; a first guard ring structure located in the termination region of the silicon carbide layer and adjacent to the top surface of the silicon carbide layer, wherein the first guard ring structure includes at least one first guard ring well region; and a second guard ring structure located in the in the silicon carbide layer and below the first guard ring structure, wherein the second guard ring structure is separated from the top surface of the silicon carbide layer, and the second guard ring structure includes at least one second guard ring well region corresponding to the at least one first guard ring well region in the vertical direction.

Embodiments of the present disclosure relate to a method of fabricating a semiconductor structure. The method includes: forming a first silicon carbide layer on a semiconductor layer, wherein the semiconductor structure includes a unit region and a termination region surrounding the unit region; forming at least one first guard ring well region in the first silicon carbide layer, wherein the first guard ring well region is located at least in the termination region, and the first guard ring well region adjoins the top surface of the first silicon carbide layer; after forming the first guard ring well region, forming a second silicon carbide layer on the first silicon carbide layer; and forming at least one second guard ring well region in the second silicon carbide layer, wherein the at least one second guard ring well region is located in the termination region and surrounds the unit region, the second guard ring well region is located within the vertical projection coverage of the at least one first guard ring well region, and the at least one second guard ring well region adjoins the top surface of the second silicon carbide layer.

In accordance with one aspect of the present disclosure, a semiconductor structure is provided, which includes: a silicon carbide layer comprising a unit region and a termination region surrounding the unit region; a first guard ring structure in the termination region of the silicon carbide layer, the first guard ring structure adjoining a top surface of the silicon carbide layer, and including at least one first guard ring well region; and a second guard ring structure in the silicon carbide layer and below the first guard ring structure, the second guard ring structure including at least one second guard ring well region corresponding to the at least one first guard ring well region in a vertical direction.

In accordance with another aspect of the present disclosure, a method is provided that includes: forming a first silicon carbide layer on a semiconductor layer, the semiconductor structure comprising a unit region and a termination region surrounding the unit region; forming at least one first guard ring well region in the first silicon carbide layer, the at least one first guard ring well region being located at least in the termination region, and adjoining a top surface of the first silicon carbide layer; after forming the at least one first guard ring well region, forming a second silicon carbide layer on the first silicon carbide layer; and forming at least one second guard ring well region in the second silicon carbide layer, the at least one second guard ring well region being located in the termination region and surrounding the unit region, the at least one second guard ring well region being located within a coverage of a vertical projection of the at least one first guard ring well region, and the at least one second guard ring well region adjoining a top surface of the second silicon carbide layer.

BRIEF DESCRIPTION OF THE DRAWINGS

Aspects of embodiments of the present disclosure may be better understood from the following detailed description when read with accompanying drawings. It should be noted that various structures may not be drawn to scale. In fact, the dimensions of the various structures may be enlarged or reduced at will for clarity of discussion.

For a more complete understanding of the present disclosure, and the advantages thereof, reference is now made to the following descriptions taken in conjunction with the accompanying drawings, in which.

The same or similar components are labeled with the same reference numerals in the drawings and detailed description. Embodiments of the present disclosure will be readily understood from the following detailed description taken in conjunction with the accompanying drawings.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
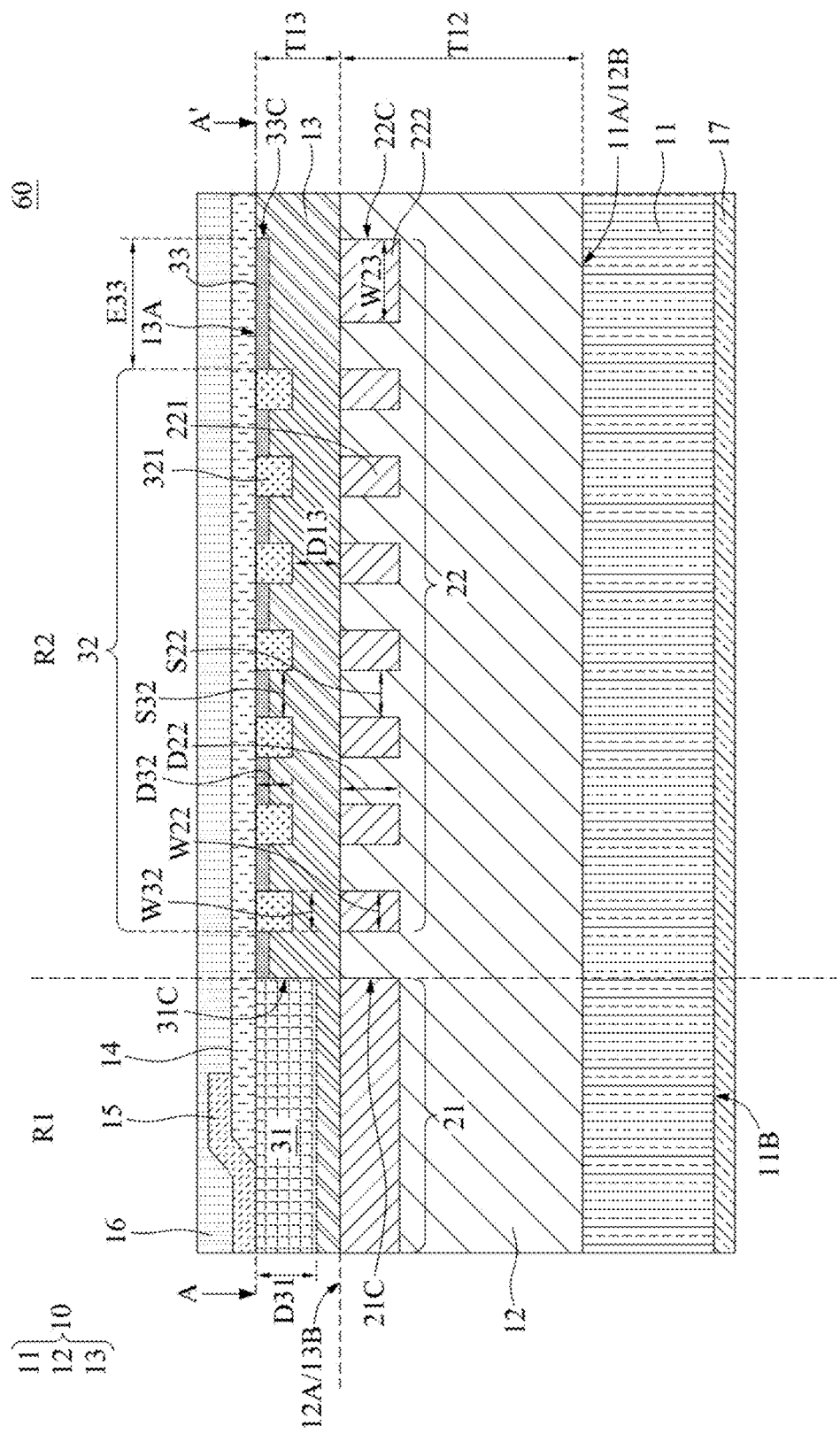
FIG. 1 is a cross-sectional view of an example semiconductor structure according to embodiments of the present disclosure.

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Further, one or more features from one or more of the following described embodiments may be combined to create alternative embodiments not explicitly described, and features suitable for such combinations are understood within the scope of this disclosure. It is therefore intended that the appended claims encompass any such modifications or embodiments.

The following disclosure provides various different embodiments or examples for implementing different features of the presented subject matter. Specific embodiments of components and configurations are described below. Certainly, these are examples only and are not intended to be limiting. In this disclosure, references to forming a first feature over or on a second feature may include embodiments where the first and second features are formed in direct contact, and may also include embodiments where an additional feature is formed between the first feature and the second feature such that the first feature and the second feature may not be in direct contact. In addition, the present disclosure may repeat reference signs and/or letters in various embodiments. Such repetition is for simplicity and clarity and does not in itself indicate a relationship between the various embodiments and/or configurations discussed.

Embodiments of the present disclosure are discussed in detail below. It should be appreciated, however, that the present disclosure provides applicable concepts that can be embodied in a wide variety of specific contexts. The specific embodiments discussed herein are illustrative only, and do not limit the scope of the present disclosure.

Silicon carbide has many advantages suitable for production of electronic components, especially for components in power supply applications. However, due to its material properties, doped ions are not easily diffused in the silicon carbide substrate, resulting in the inability to form a deeper well region (i.e., a doped region), which also causes the electric field, which is generated during operation of a semiconductor device having a silicon carbide substrate, to be close to the top surface of the silicon carbide substrate. This limits the breakdown voltage of silicon carbide semiconductor devices. Further, due to the shallow position of the electron peak (e-peak), carriers in acceleration (for example, during a reverse current operation) may hit a contact area (interface) between the silicon carbide and oxides (such as silicon oxide), causing surface charge accumulation, and resulting in excessive positive charges in the oxide layer, which in turn leads to a decreased reliability of silicon carbide semiconductor devices.

In order to resolve the above-mentioned problems in the art, embodiments of the present disclosure provide semiconductor structures with a double-layer floating guard ring terminal and manufacturing methods thereof. The double-layer floating guard ring terminal can lower the position of the electron peak in the silicon carbide substrate, thereby reducing the problem of surface charge accumulation caused by carriers hitting the interface due to high voltage acceleration, and improving the reliability of silicon carbide semiconductor devices.

Figure 2:
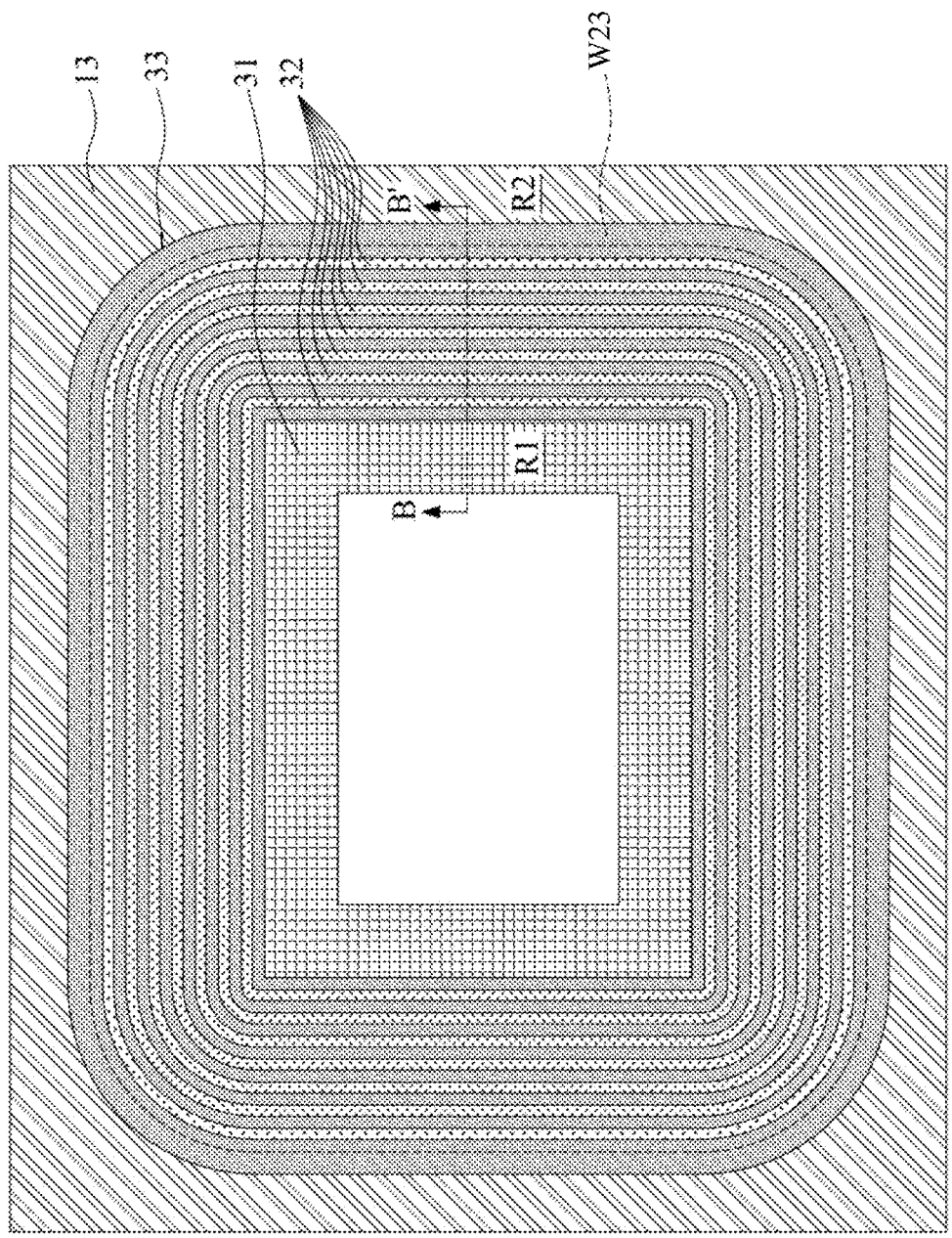
FIG. 2 is an example top view of the semiconductor structure in FIG. 1 according to embodiments of the present disclosure.

FIG. 1 and FIG. 2 are schematic structural diagrams of an example semiconductor structure 60 according to certain embodiments of the present disclosure. FIG. 1 is an example cross-sectional view of the semiconductor structure 60 along a line BB' in FIG. 2. FIG. 2 is a top view of the semiconductor structure 60 along a line AA' in FIG. 1. At least some of the figures have been simplified for better understanding of aspects of the present disclosure.

Referring to FIGS. 1 and 2, the semiconductor structure 60 includes a semiconductor layer 11, a first silicon carbide layer 12, and a second silicon carbide layer 13 stacked in a vertical direction. The semiconductor layer 11, the first silicon carbide layer 12, and the second silicon carbide layer 13 together form a substrate 10. The substrate 10 is divided into a unit region R1 and a termination region R2 surrounding the unit region R1. The unit region R1 serves as an active region of the semiconductor structure 60 and is used to accommodate active components, such as vertical power semiconductor devices or other types of power semiconductor devices. The vertical power semiconductor devices may include a power metal-oxide-semiconductor field-effect transistor (MOSFET), double-diffused MOSFET (DMOSFET), insulated-gate bipolar transistor (IGBT), or junction gate field-effect transistor (JFET). Specifically, the semiconductor structure 60 may have a vertical current conduction path. The termination region R2 is used to accommodate passive components and/or circuit terminals. The passive components may include capacitor structures, and the circuit terminals may include guard ring structures.

The semiconductor layer 11 has opposite surfaces 11A and 11B. The first silicon carbide layer 12 has opposite surfaces 12A and 12B. The second silicon carbide layer 13 has opposite surfaces 13A and 13B. The semiconductor layer 11, the first silicon carbide layer 12, and the second silicon carbide layer 13 are stacked in the vertical direction. In some embodiments, the surface 11A of the semiconductor layer 11 contacts the surface 12B of the first silicon carbide layer 12, and the surface 12A of the first silicon carbide layer 12 contacts the surface 13B of the second silicon carbide layer 13. For the convenience of illustration, the stacked structure of the semiconductor layer 11, the first silicon carbide layer 12, and the second silicon carbide layer 13 is defined as the substrate 10, where the surface 13A of the second epitaxial layer 13 (i.e., the second silicon carbide layer 13) defines the top surface of the substrate 10, and the surface 11B of semiconductor layer 11 defines the bottom surface of the substrate 10. For the convenience of illustration, the direction orthogonal to (or perpendicular to) the top surface and the bottom surface of the substrate 10 is defined as the vertical direction, and the direction orthogonal to (or perpendicular to) the vertical direction is defined as the horizontal direction. In some embodiments, the surface 11A, the surface 11B, the surface 12A, the surface 12B, the surface 13A, and the surface 13B are parallel to each other and may be horizontal planes extending in the horizontal direction.

The semiconductor layer 11 may be polycrystalline silicon or single crystal silicon. The semiconductor layer 11 may include N-type or P-type doping. For example, the semiconductor material layer 11 may include a P-type doped region, which may be configured as an N-type transistor, and an N-type doped region, which may be configured as a P-type transistor. The N-type doped region is doped with an N-type dopant, such as phosphorus, arsenic, other N-type dopants, or a combination thereof. The P-type doped region is doped with a P-type dopant, such as boron, indium, other P-type dopants, or a combination thereof. The N-type or P-type doped region may be formed by use of an ion implantation process, a diffusing process and/or other applicable doping processes. The semiconductor layer 11 has a doped region of a first type, extends from the surface 11A to the surface 11B, and covers the entire surface 11A. For the convenience of illustration, N-type will be used as the first type in the following description as an example, however, the disclosure is not limited thereto. Whether the semiconductor layer 11 is the N-type (first type) or the P-type (second type) may be adjusted according to the conductivity type of the semiconductor structure 60.

The first silicon carbide layer 12 and the second silicon carbide layer 13 have the same conductivity type as the semiconductor layer 11, that is, having the first type doping. In some embodiments, ions with N-type electrical properties may be introduced for epitaxial growth to form the N-type silicon carbide layer 12 without the need of additional ion implantation. In some embodiments, ions with N-type electrical properties may be evenly distributed throughout the first silicon carbide layer 12. The semiconductor layer 11, serving as the drain contact well region of the semiconductor structure 60, needs to have a high first type doping concentration. In some embodiments, the first type doping concentration of the first silicon carbide layer 12 is less than the first type doping concentration of the semiconductor layer 11. For the formation method of the second silicon carbide layer 13, reference may be made to the formation method of the first silicon carbide layer 12, which will not be repeated here. In some embodiments, there is an observable interface between first silicon carbide layer 12 and second silicon carbide layer 13. In some embodiments, the first type doping concentration of the second silicon carbide layer 13 is greater than the first type doping concentration of the first silicon carbide layer 12. In some embodiments, the first type doping concentration of the second silicon carbide layer 13 is between $1\times10^{16}$ and $1\times10^{18}$ per cubic centimeter ($cm^{-3}$), and the first type doping concentration of the first silicon carbide layer 12 is between $1\times10^{15}$ and $5\times10^{17}$ $cm^{-3}$. The second silicon carbide layer 13 having a higher doping concentration helps reduce the resistance (Rds(ON)) between the drain and the source when the semiconductor structure 60 operates (starts), and the first silicon carbide layer 12 having a lower doping concentration helps increase the breakdown voltage.

The semiconductor structure 60 may also include a transition guard ring structure 21, a deep guard ring structure 22, a shallow guard ring structure 32, a transition well region 31 and a compensation well region 33, which are formed in the substrate 10. The semiconductor structure 60 may further include a field oxide layer 14, a field plate 15, an interlayer dielectric layer (ILD) 16 and a field plate 17, which are disposed on the top/bottom surfaces of the substrate 10.

The field oxide layer 14 is disposed on the top surface of the substrate 10, and covers the termination region R2 and a portion of the unit region R1 that is adjacent to the termination region R2. In some embodiments, the field oxide layer 14 covers part of the transition well region 31. In some embodiments, the field oxide layer 14 contacts the top surface 13A of the second silicon carbide layer 13. In some embodiments, the material of the field oxide layer 14 includes silicon oxide. The field plate 15 is located in the unit region R1 and covers at least the transition well region 31 and a portion of the field oxide layer 14 located in the unit region R1. In some embodiments, the field plate 15 serves as the source electrode plate of the semiconductor structure 60. In some embodiments, the field plate 15 includes a metallic material. The interlayer dielectric layer 16 is disposed on the field oxide layer 14 and the field plate 15, and covers the unit region R1 and the termination region R2. In some embodiments, the interlayer dielectric layer 16 covers the entire top surface 13A of the second silicon carbide layer 13. In some embodiments, the interlayer dielectric layer 16 is separated from the second silicon carbide layer 13 in the termination region R2 via the field oxide layer 14. The field plate 17 is located on the surface 11B of the semiconductor layer 11, and is disposed on an opposite side (bottom) of the substrate 10. In some embodiments, the field plate 17 covers the entire surface 11B of the semiconductor layer 11. In some embodiments, the field plate 17 serves as the drain electrode plate of the semiconductor structure 60. In some embodiments, the field plate 17 includes a metallic material.

The transition well region 31 is located at the side of the unit region R1 of the substrate 10, surrounds the active components of the unit region R1, and adjoins the termination region R2. The transition well region 31 adjoins the top surface of the substrate 10 (i.e., the surface 13A of the second silicon carbide layer 13), and extends from the surface 13A toward the surface 13B. The depth of the transition well region 31 can be adjusted according to the requirements of devices and is not limited here. In some embodiments, the transition well region 31 may be annular when viewed from the top view of FIG. 2. The configuration and shape of the transition well region 31 may be adjusted according to the design of the wafer, e.g., the transition well region 31 may be a circular, square, rectangular or other shaped ring. In some embodiments, the depth of the transition well region 31 is less than or equal to the thickness T13 of the second silicon carbide layer 13. In some embodiments, the transition well region 31 has a conductivity type different from that of the substrate 10, that is, the transition well region 31 may have a second type doping. In some embodiments, the second type doping concentration of the transition well region 31 ranges from $1\times10^{16}$ to $1\times10^{20}$ $cm^{-3}$. In some embodiments, the depth D31 of the transition well region 31 in the vertical direction from the surface 13A is in the range of 0.1-3 micrometers (μm).

The shallow guard ring structure 32 is located in the termination region R2 of the substrate 10, and adjoins the top surface of the substrate 10 (i.e., the surface 13A of the second silicon carbide layer 13). The shallow guard ring structure 32 is composed of a plurality of guard ring well regions 321 separated from each other. In some embodiments, when being viewed from the top view of FIG. 2, each guard ring well region 321 may be annular and surrounds the unit region R1. The configuration and shape of the guard ring well regions 321 may be adjusted according to the design of the wafer, e.g., the guard ring well regions 321 may be circular, square, rectangular or other shaped rings. In addition, the number of the guard ring well regions 321 may be adjusted according to the operating voltage and other circuit characteristics of the devices, and is not limited here.

The guard ring well regions 321 are located in the second silicon carbide layer 13 and extend from the surface 13A toward the surface 13B. The depths D32 of the guard ring well regions 321 are less than or equal to the thickness T13 of the second silicon carbide layer 13. The guard ring well regions 321 have a second conductivity type that is different from the first conductivity type of the second silicon carbide layer 13. In some embodiments, each guard ring well region 321 is a P-type doped region. In some embodiments, the second type doping concentration of the guard ring well regions 321 is greater than or equal to the second type doping concentration of the transition well region 31. In some embodiments, the second type doping concentration of the guard ring well regions 321 is between $1\times10^{18}$ and $1\times10^{21}$ cm$^{-3}$. In some embodiments, the plurality of guard ring well regions 321 of the shallow guard ring structure 32 have approximately the same depth D32. In some embodiments, the depths D32 of the plurality of guard ring well regions 321 of the shallow guard ring structure 32 are less than or equal to the depth D31 of the transition well region 31. In some embodiments, the depths D32 of the guard ring well regions 321 are between 0.1 μm and 3 μm. In some embodiments, the thickness T13 of the second silicon carbide layer 13 ranges from 0.1 μm to 5 μm. In order for the guard ring well regions 321 to be electrically separated from each other, adjacent guard ring well regions 321 may be separated by a portion of the second silicon carbide layer 13 having the first conductivity type. In some embodiments, the spacing S32 between adjacent guard ring well regions 321 is between 0.1 μm and 2 μm. In some embodiments, the width W32 of a single guard ring well region 321 ranges from 0.1 μm to 3 μm.

The compensation well region 33 is located in the termination region R2 of the second silicon carbide layer 13, and adjoins the surface 13A of the second silicon carbide layer 13. The depth of the compensation well region 33 is smaller than that of the shallow guard ring structure 32 (or each guard ring well region 321). In some embodiments, the depth of the compensation well region 33 is between 0.1 μm and 3 μm. The compensation well region 33 may at least be disposed between adjacent guard ring well regions 321. In some embodiments, the compensation well region 33 may determine the area of the semiconductor structure 60. The area of the semiconductor structure 60 refers to the effective area of the semiconductor structure 60 in operation. Although the compensation well region 33 may not cover the entire second silicon carbide layer 13 outside of the unit region R1, in practice, the outermost edge of a substrate may generally be left as blank during manufacturing of a semiconductor device. Thus, the outermost edge of the substrate is not included in the area of the semiconductor device. Therefore, a portion of the second silicon carbide layer 13 outside the compensation well region 33 shown in FIG. 2 may not be considered when determining the area of the semiconductor structure 60. In some embodiments, the area of the semiconductor structure 60 may be composed of the unit region R1 and the termination region R2, and the compensation well region 33 may cover the entire termination region R2. In some embodiments, the width E33 of a portion of the compensation well region 33 that extends outward from the shallow guard ring structure 32 is between 0.1 μm and 20 μm.

The compensation well region 33 has a conductivity type different from that of the second epitaxial layer 13, that is, the compensation well region 33 has a second type doping. In some embodiments, the second type doping concentration of the compensation well region 33 is less than the second-type doping concentration of the shallow guard ring structure 32. In some embodiments, the second type doping concentration of the compensation well region 33 ranges from $1\times10^{15}$ to $1\times10^{17}$ cm$^{-3}$. The charges in the compensation well region 33 can neutralize the positive charges that may accumulate in the field oxide layer 14 during operation of the semiconductor structure 60, which reduces the sensitivity of the semiconductor structure 60 to surface charges at the interface between the second silicon carbide layer 13 and the field oxide layer 14, that is, the semiconductor structure 60 is made insensitive to the surface charges, thereby improving the reliability of the semiconductor structure 60.

The deep guard ring structure 22 is located in the termination region R2 of the substrate 10, and is located in the first silicon carbide layer 12 below the shallow guard ring structure 32. The deep guard ring structure 22 extends from the surface 12A toward the surface 12B. That is to say, the deep guard ring structure 22 is separated from the surface 13A of the second silicon carbide layer 13. The deep guard ring structure 22 may include one or more guard ring well regions 221 overlapping the shallow guard ring structure 32. The guard ring well regions 221 have a second conductivity type that is different from the first conductivity type of the first silicon carbide layer 12. In some embodiments, each guard ring well region 221 is a P-type doped region. The doping concentration of the deep guard ring structure 22 is lower than the doping concentration of the shallow guard ring structure 32. In some embodiments, the second type doping concentration of the guard ring well regions 221 may range from $1\times10^{14}$ to $1\times10^{17}$ cm$^{-3}$. As shown in FIG. 1, in an embodiment where the deep guard ring structure 22 includes a plurality of guard ring well regions 221, each guard ring well region 221 may have approximately the same depth D22. The depth D22 may be smaller than the thickness T12 of the first silicon carbide layer 12. In other words, the deep guard ring structure 22 ends within the first silicon carbide layer 12 and is separated from the surface 12B. The deep guard ring structure 22 may contact the bottom of the shallow guard ring structure 32, or may be separated from the shallow guard ring structure 32 by a portion of the second silicon carbide layer 13 having the first conductivity type. In some embodiments, the distance D13 between the guard ring well region 221 and the guard ring well region 321 in the vertical direction is in a range of 0-3 μm.

One or more guard ring well regions 221 may correspond to at least one guard ring well region 321 along the vertical direction. The deep guard ring structure 22 may include a single guard ring well region 221 located below and overlapping the entire shallow guard ring structure 32; or the deep guard ring structure 22 may include multiple guard ring well regions 221 such that the lower corners of the guard ring well region 321 of the shallow guard ring structure 32 overlap the multiple guard ring well regions 221. In the embodiment shown in FIG. 1, the number of the guard ring well regions 221 is the same as the number of the guard ring well regions 321. In some embodiments, the center of a guard ring well region 221 is aligned with the center of a corresponding guard ring well region 321 above. The width W22 of each guard ring well region 221 may be greater than or equal to the width W32 of a guard ring well region 321 above. In the embodiment of FIG. 1, the width W22 of each guard ring well region 221 is equal to the width W32 of the guard ring well region 321 above. In some embodiments, the spacing S22 of adjacent guard ring well regions 221 is less than or equal to the spacing S32 of the adjacent guard ring well regions 321 above. In some embodiments, a guard ring well region 321 may be located within the coverage range of a guard ring well region 221 below in the vertical direction.

For the convenience of illustration, the edges (or boundaries) of a well region for connecting the bottom and the top of the well region are defined as side edges in the following. In some embodiments, the side edges of a guard ring well region 321 are aligned with the side edges of a corresponding guard ring well region 221 in the vertical direction, or are located within the coverage range of the top surface of the guard ring well region 221 in the vertical direction. In some embodiments, the spacing S22 between adjacent guard ring well regions 221 is between 0.1 μm and 2 μm. In some embodiments, the width W22 of a single guard ring well region 221 ranges from 0.1 μm to 3 μm.

In some embodiments, the deep guard ring structure 22 may also include a guard ring well region 222 that does not overlap with the shallow guard ring structure 32 and surrounds the guard ring well region(s) 221. The guard ring well region 222 may be connected to or separated from the guard ring well region(s) 221. In some embodiments, as shown in FIG. 1, the guard ring well region 222 and the guard ring well region(s) 221 may be separated by a portion of the first silicon carbide layer 12 having the first conductivity type. In some embodiments, when viewed from a top view of the semiconductor structure 60, the guard ring well region 222 may surround the shallow guard ring structure 32, as shown in FIG. 2. The guard ring well region 222 may be formed through the same process as the guard ring well region(s) 221. The conductivity type, doping concentration, depth range, vertical extension range, etc., of the guard ring well region 222 may all be similar to those of the guard ring well region(s) 221. For the relevant numerical range and technical characteristics, reference may be made to the descriptions about the guard ring well region(s) 221, which are not repeated here. In some embodiments, the elevation height of the guard ring well region 222 may be substantially the same as the elevation height of the guard ring well region(s) 221. The width W23 of the guard ring well region 222 may be different from the width W22 of the guard ring well region(s) 221. The width W23 of the guard ring well region 222 may be determined according to the area of the device/semiconductor structure 60 (i.e., the coverage of the compensation well region 33).

Generally, the guard ring well region 222 may only need to surround the guard ring well region(s) 221 and not exceed the area of the semiconductor structure 60. In some embodiments, the guard ring well region 222 may overlap the compensation well region 33 in the vertical direction. In some embodiments, from a top view, the entire guard ring well region 222 is located below the compensation well region 33. In some embodiments, a side edge 22C of the guard ring well region 222 that is away from the unit region R1 is aligned in the vertical direction with the side edge 33C of the compensation well region 33 that is away from the unit region R1. In some embodiments, the width W23 of the guard ring well region 222 ranges from 0.1 μm to 10 μm.

Generally, when a semiconductor device is operating, the electric field intensity may be concentrated at the edge of a well region, such as the lower edge of the well region. Due to the tip discharge effect, the electric field may be particularly concentrated at the lower corners of the well region. A regionally concentrated electric field is detrimental to a semiconductor device. Especially, when the semiconductor device is operating, and if the electric field is concentrated in the termination region instead of the unit region, the performance of the semiconductor device will be affected. Further, when silicon carbide is used as a substrate, compared to polysilicon substrates, there may also be problems such as limited breakdown voltage and reduced reliability as mentioned above.

The embodiment semiconductor structures of the present disclosure have a double-layer guard ring structure with one layer arranged below (or above) the other (i.e., the shallow guard ring structure 32, and the deep guard ring structure 22 located below the shallow guard ring structure 32). With such a structure, the electric field may be pushed downwardly inside the substrate, which may thus reduce the height of the e-peak in the termination region R2, or prevent the e-peak from falling in the termination region R2, thereby increasing the breakdown voltage and improving reliability. Considering the tip discharge effect, the deep guard ring structure 22 may at least overlap the corners of the shallow guard ring structure 32 in the vertical direction, thereby effectively pushing the electric fields formed at the lower edge and corners of the shallow guard ring structure 32 downwardly inside the substrate. In addition, the guard ring well region 222 of the deep guard ring structure 22 may move the depletion region outwardly, which increases the range of the depletion region without affecting the size of the components, and further increases the breakdown voltage of the semiconductor device.

It should be noted that, although the compensation well region 33 can reduce the sensitivity of the semiconductor structure 60 to surface charges, it cannot actually solve the fundamental problem (i.e., the problems caused by hitting of electrons (electron hitting)). While theoretically, the double-layer guard ring structure, if well designed, can eliminate the problems caused by electron hitting, the compensation well region 33 may not make a significant contribution to the reliability of the semiconductor structure 60. Practically, it is hard to completely avoid the problem of surface charge accumulation. In the case where the double-layer guard ring structure cannot completely eliminate the problem of electron hitting, the compensation well region 33 is helpful to improve the reliability of the semiconductor structure 60.

Based on the above descriptions about pushing the electric fields, in some embodiments of the present disclosure, the semiconductor structure 60 may further include a transition guard ring structure 21 that is located in the first epitaxial layer 12 (the first silicon carbide layer 12) and below the transition well region 31, and in the unit region R1. The transition guard ring structure 21 may extend from the surface 12A toward the surface 12B, and have one or more well regions. For example, in the semiconductor structure 60 shown in FIG. 1, the transition guard ring structure 21 has a single well region located right below the transition well region 31. The transition guard ring structure 21 may be formed through the same process as the guard ring well region(s) 221. The conductivity type, doping concentration, range of depth, range of vertical extension, etc., of the transition guard ring structure 21 are similar to the guard ring well region(s) 221. For the relevant numerical ranges and technical characteristics, references may be made to the descriptions about the guard ring well region(s) 221, which are not repeated here. The transition guard ring structure 21 may contact the bottom of the transition well region 31, or be separated from the transition well region 31 by a portion of the second silicon carbide layer 13 having the first conductivity type. In some embodiments, a side edge 21C of the transition guard ring structure 21 may be aligned in the vertical direction with the side edge 31C of the transition well region 31, where the side edge 31C is adjacent to the termination region R2. In some embodiments, the transition guard ring structure 21 may extend toward and into the termination region R2, and the side edge 31C of the transition well region 31 may be located within the coverage of the transition guard ring structure 21 in the vertical direction.

While the deep guard ring structure 22 can effectively increase the breakdown voltage and improve reliability, the electric fields concentrated on the lower edge and corners of the transition well region 31 may cause the e-peak to be concentrated in a position adjacent to the termination region R2 rather than the active components in the unit region R1. If the e-peak can be pushed into the unit region R1, the breakdown voltage can be further increased. The transition guard ring structure 21 can push the electric field to the lower portion inside the substrate, and the height of the e-peak of the electric field pushed downwardly may be decreased. Therefore, in view of the semiconductor structure 60 as a whole, pushing the e-peak toward the inside of the unit region R1 is beneficial to further increasing the breakdown voltage.

Based on the semiconductor structure 60, comparing a semiconductor structure that does not have the deep guard ring structure 22 and the transition guard ring structure 21, with the semiconductor structure 60 having the deep guard ring structure 22 and the transition guard ring structure 21, the semiconductor structure 60 may have a breakdown voltage that is about 250 v to 300 v higher, with the height of the e-peak in the termination region R2 reduced by at least 20%, and the total resistivity reduced by about 20%. Therefore, the semiconductor structure 60 of the embodiments of the present disclosure has significant advantages.

FIG. 3 to FIG. 6 are diagrams illustrating one or more example stages in a manufacturing method of the semiconductor structure 60 in accordance with certain embodiments of the present disclosure. At least some of the drawings have been simplified for better understanding of aspects of the present disclosure.

Figure 3:
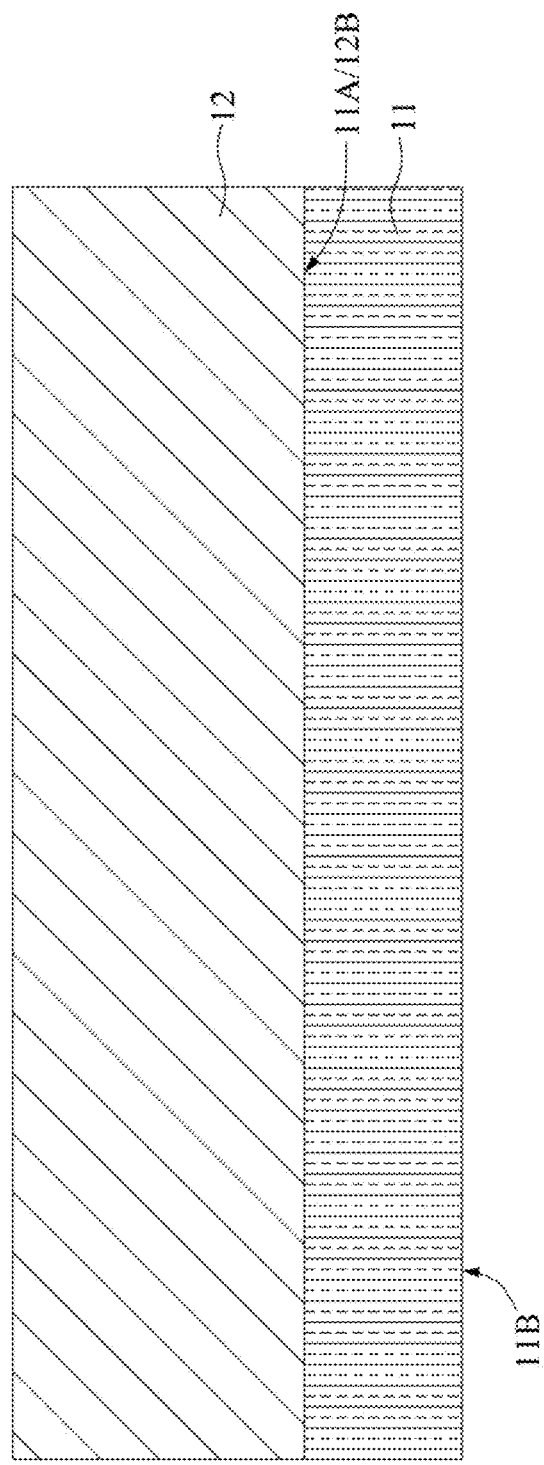
FIGS. 3, 4, 5, 6 and 7 are diagrams illustrating one or more example stages in a method of manufacturing a semiconductor structure according to embodiments of the present disclosure.

Referring to FIG. 3, the manufacturing method of the semiconductor structure 60 includes performing epitaxial growth to form the first silicon carbide layer 12 on the surface 11A of the semiconductor layer 11. The material of the semiconductor layer 11 may be polycrystalline silicon or single crystal silicon. In some embodiments, the surface 11A is the top surface of the silicon wafer. The semiconductor layer 11 may include, for example, the aforementioned first type doped region covering the entire surface 11A. The first silicon carbide layer 12 has the same conductivity type as the semiconductor layer 11, i.e., the first type doping. For the formation method and doping concentration of the first type doping of the first silicon carbide layer 12, reference may be made to the description above, which is not repeated herein.

Figure 4:
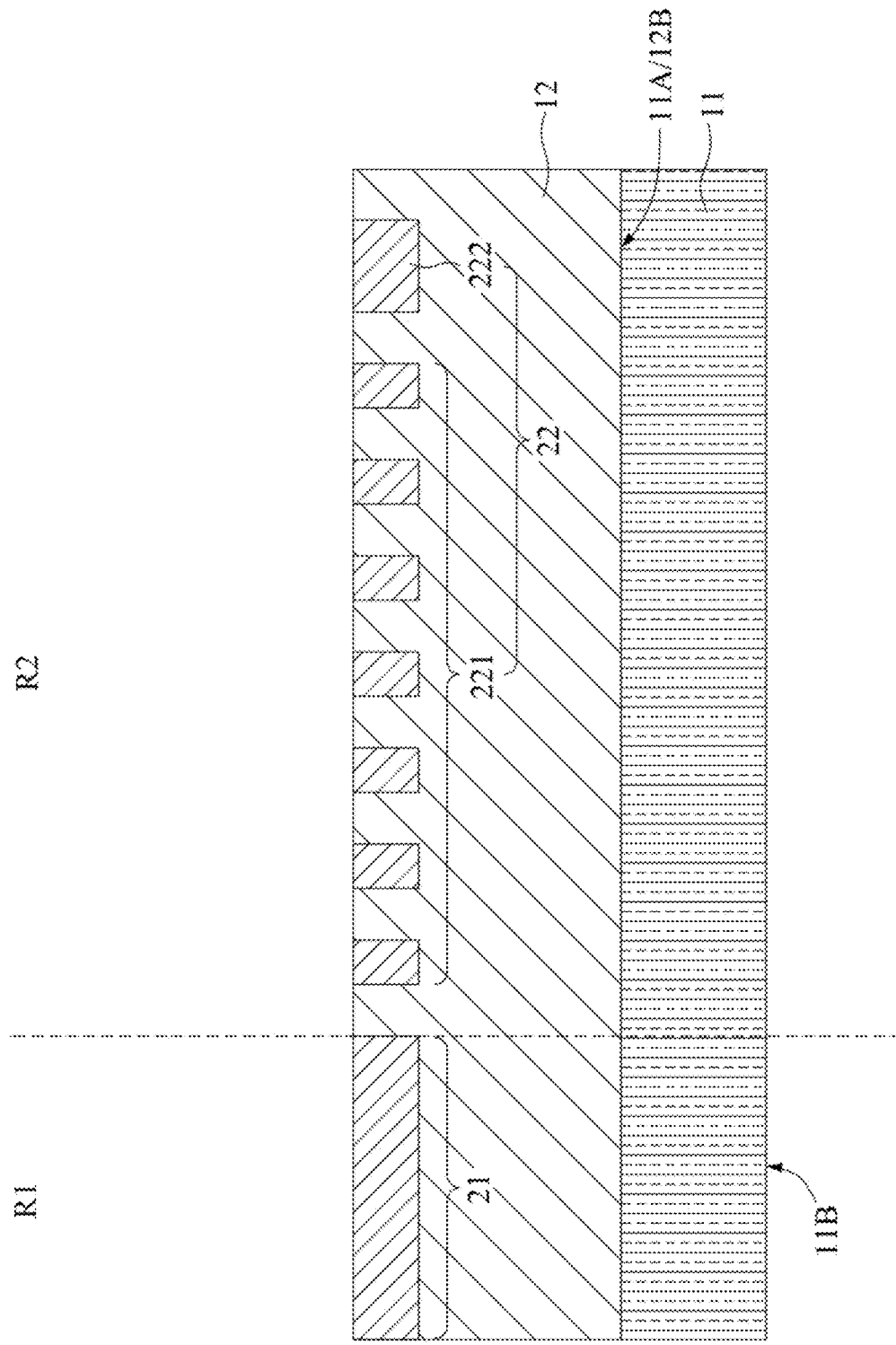

Referring to FIG. 4, the manufacturing method of the semiconductor structure 60 includes performing a first ion implantation process to the first silicon carbide layer 12 on the surface 12A of the first silicon carbide layer 12, to form the transition guard ring structure 21 and the deep guard ring structure 22. In some embodiments, before performing the first ion implantation process, a patterned photoresist layer may be formed on the surface 12A of the first silicon carbide layer 12 to define positions of the transition guard ring structure 21 and the deep guard ring structure 22 (including the guard ring well regions 221, 222), and then the first ion implantation process may be performed on the first silicon carbide layer 12, using the patterned photoresist layer as a mask. In some embodiments, the positions of the transition guard ring structure 21 and the deep guard ring structure 22 may be defined via one or more patterned photoresist layers. In some implementations, the transition guard ring structure 21 and the deep guard ring structure 22 may be formed through a single ion implantation (i.e., a single patterned mask is used to define the positions of the transition guard ring structure 21 and the deep guard ring structure 22, and the first ion implantation process includes a single ion implantation step), and thus, the transition guard ring structure 21 and the deep guard ring structure 22 may have approximately the same depth. In an embodiment where multiple patterned photoresist layers are used to define the positions of the transition guard ring structure 21 and the deep guard ring structure 22, the transition guard ring structure 21 and the deep guard ring structure 22 may be formed by use of multiple ion implantations corresponding to different patterned photoresist layers (i.e., by iteratively performing the steps of forming a patterned photoresist layer, performing ion implantation, and removing the patterned photoresist layer). As the material characteristics of silicon carbide makes it difficult for ions to diffuse, and with limitation of the existing processes and equipments, the depths of the transition guard ring structure 21 and the deep guard ring structure 22 may generally not exceed 3 μm, however, the present disclosure is not limited thereto. With the advancement of technologies and processes, or the development of special ion implantation methods, the depths of the transition guard ring structure 21 and the deep guard ring structure 22 can be greater than 3 μm.

Figure 5:
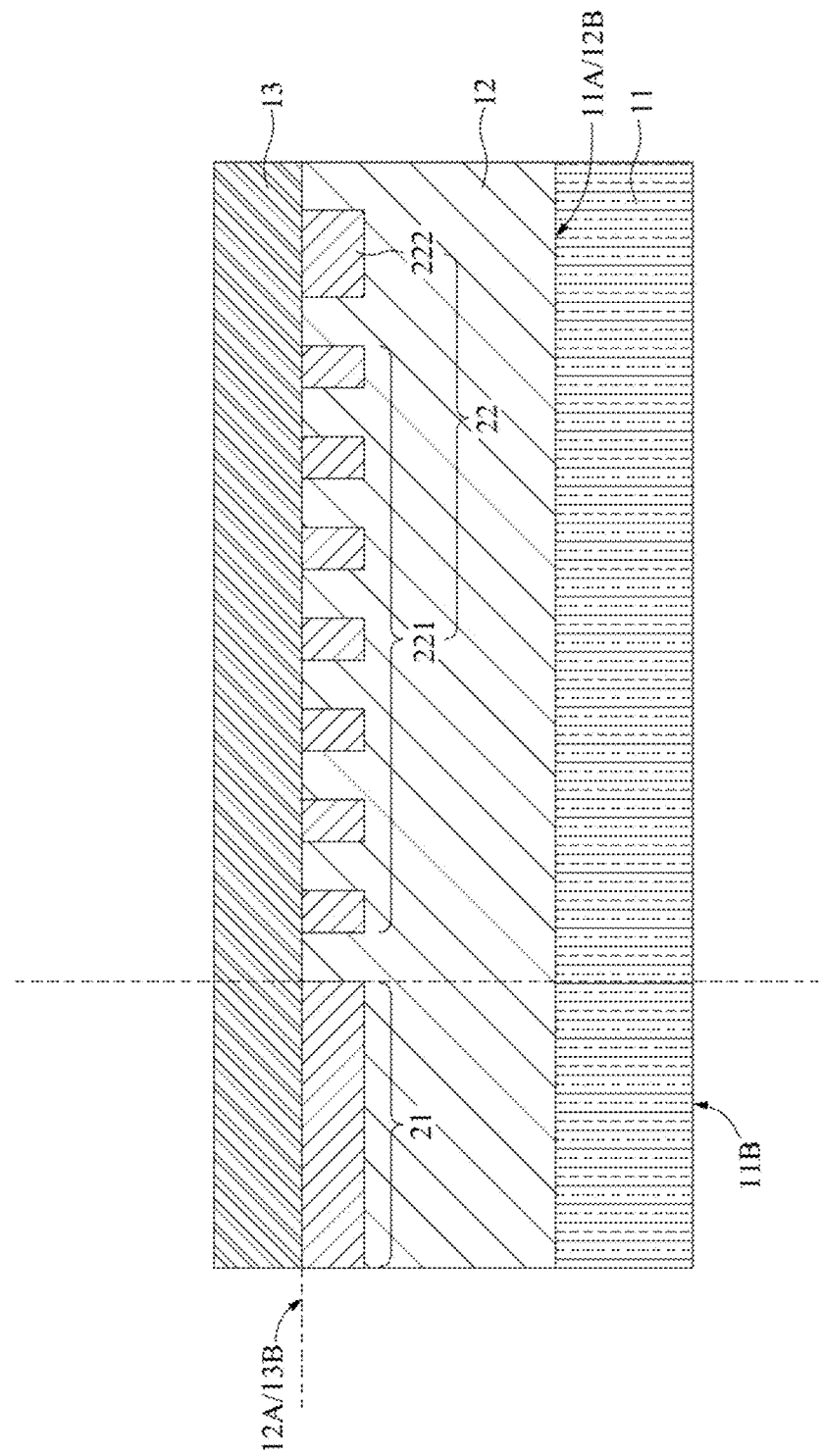

Referring to FIG. 5, the manufacturing method of the semiconductor structure 60 includes performing epitaxial growth on the surface 12A of the first silicon carbide layer 12 to form the second silicon carbide layer 13. The second silicon carbide layer 13 has the same conductivity type as the first silicon carbide layer 12, that is, the first type doping. For the formation method, doping concentration, and thickness range of the first type doping of the second silicon carbide layer 13, reference may be made to the above descriptions, which are not repeated herein. In some embodiments, after performing the first ion implantation process and before forming the second silicon carbide layer 13, a thermal annealing process may be performed to the first silicon carbide layer 12.

Figure 6:
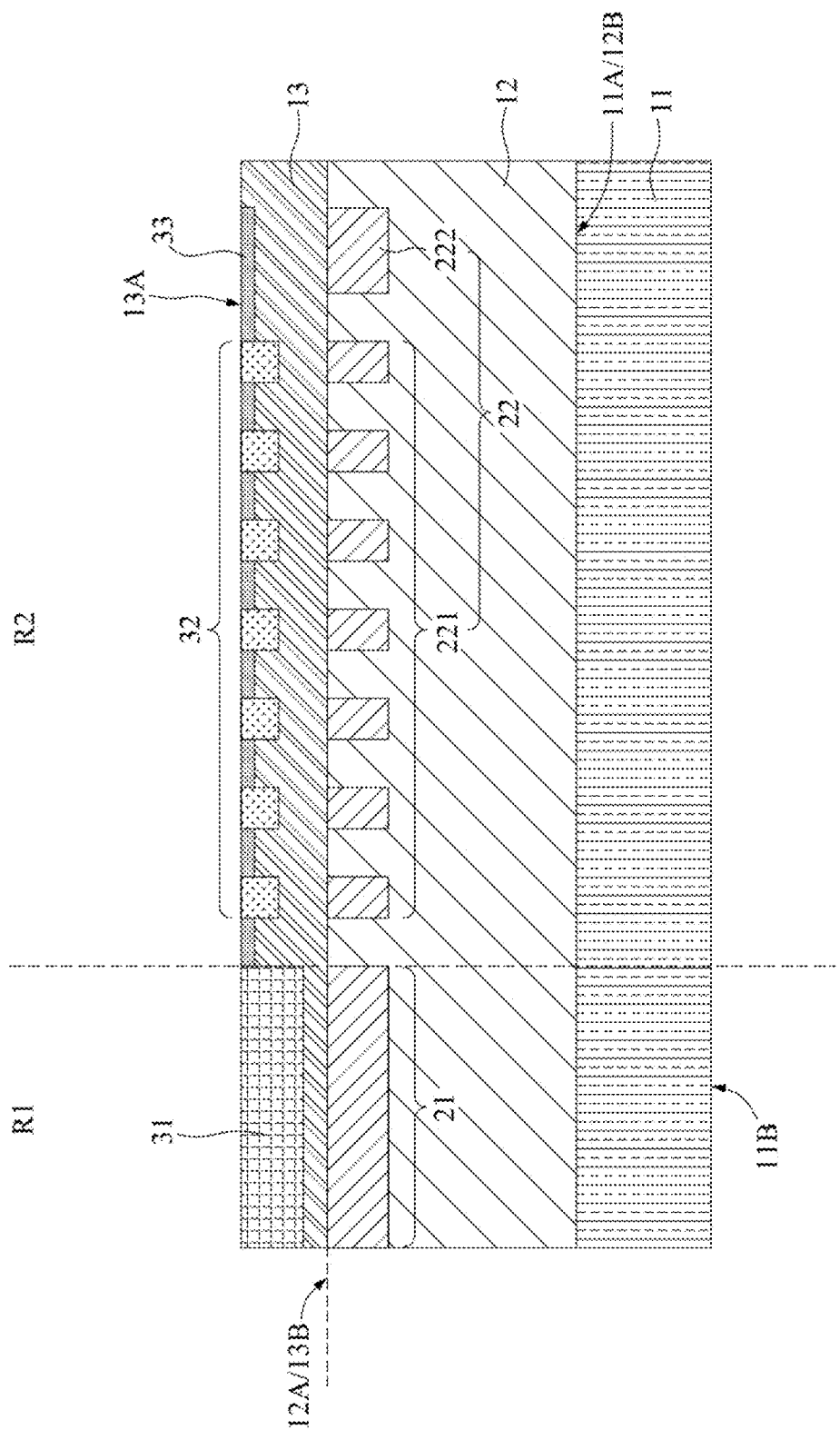

Referring to FIG. 6, the manufacturing method of the semiconductor structure 60 includes performing, on the surface 13A of the second silicon carbide layer 13, a second ion implantation process on the second silicon carbide layer 13, to form the transition well region 31 and the shallow guard ring structure 32. In some embodiments, before the second ion implantation process is performed, a patterned photoresist layer may be formed on the surface 13A of the second silicon carbide layer 13, to define the positions of the transition well region 31 and the shallow guard ring structure 32 (including a plurality of guard ring well regions 321), and then the second ion implantation process may be performed on the second silicon carbide layer 13 using the patterned photoresist layer as a mask. There may be one or more patterned photoresist layers that are used to define the transition well region 31 and the shallow guard ring structure 32. The number of ion implantations in the second ion implantation process may be determined according to the number of the patterned photoresist layers. The compensation well region 33 may be formed before or after the transition well region 31 and the shallow guard ring structure 32 are formed. In some embodiments, the position of the compensation well region 33 may be defined through a patterned photoresist layer. The patterned photoresist layer for defining the position of the compensation well region 33 is different from the patterned photoresist layer(s) for defining the positions of the transition well region 31 and the shallow guard ring structure 32. In some embodiments, the patterned photoresist layer for defining the position of the shallow guard ring structure 32 and the patterned photoresist layer for defining the positions of the guard ring well region(s) 221 of the deep guard ring structure 22 may be defined via the same photomask. In this way, the shallow guard ring structure 32 can be aligned with each guard ring well region 221 of the deep guard ring structure 22 above the deep guard ring structure 22.

Figure 7:
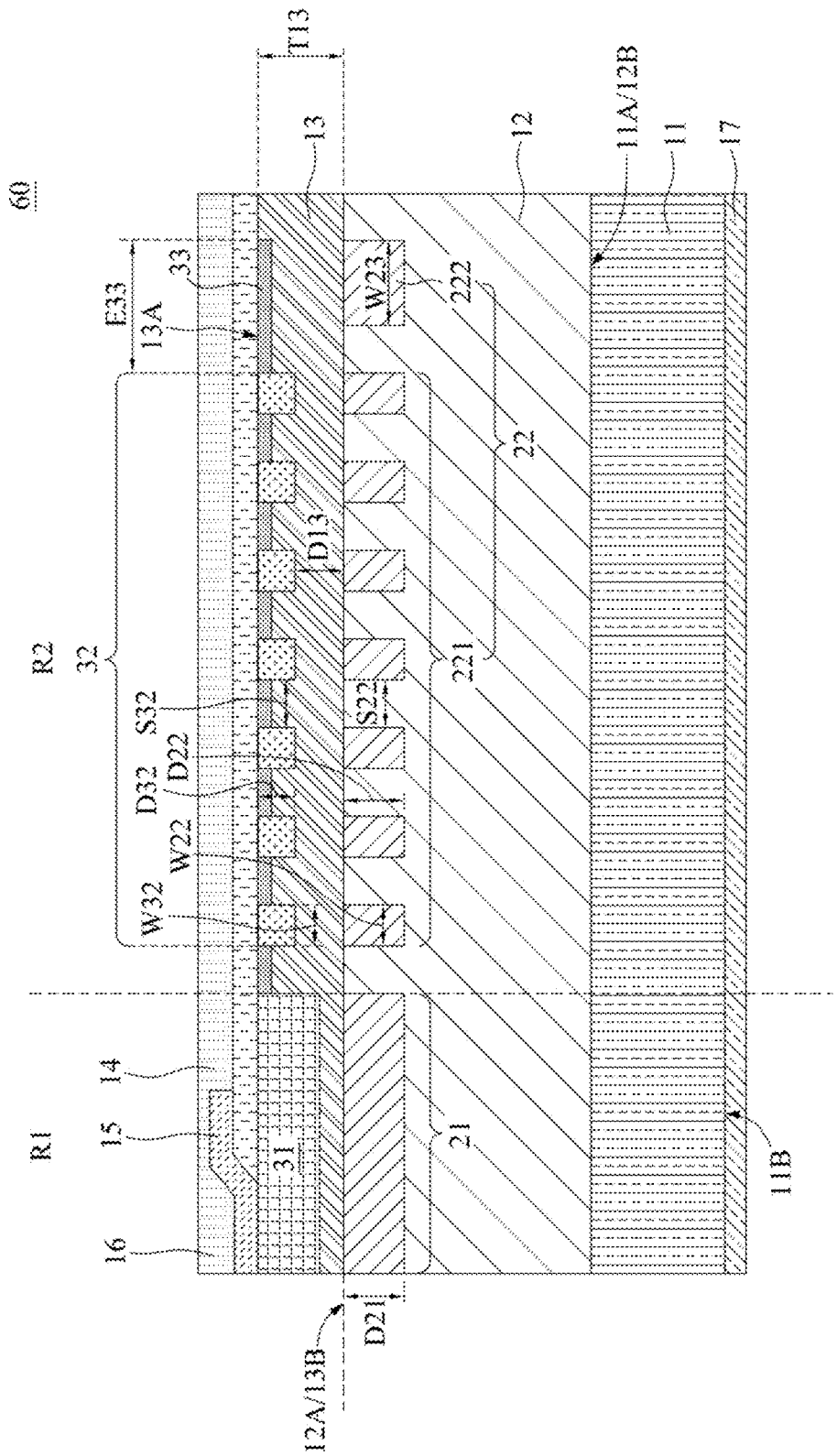

Referring to FIG. 7, the manufacturing method of the semiconductor structure 60 includes sequentially forming the field oxide layer 14, the field plate 15 and the interlayer dielectric layer 16 on the surface 13A of the second silicon carbide layer 13, and forming the field plate 17 on the surface 11B of the semiconductor layer 11. The formation of the field oxide layer 14, the field plate 15, the interlayer dielectric layer 16, and the field plate 17 may include a deposition process, an etching process, a chemical mechanical polishing process (CMP), and so on. A formation process may be chosen based on needs or applications.

Different embodiments having similar or identical functions to the semiconductor structure 60 described above are provided below. For illustration clarity, the field oxide layer 14, the field plate 15, and the interlayer dielectric layer 16 are omitted in FIGS. 8-20. Further, only the differences between different embodiments will be described below, and relevant descriptions of structures or process/methods the same as or similar to the previous embodiments will be omitted.

Figure 8:
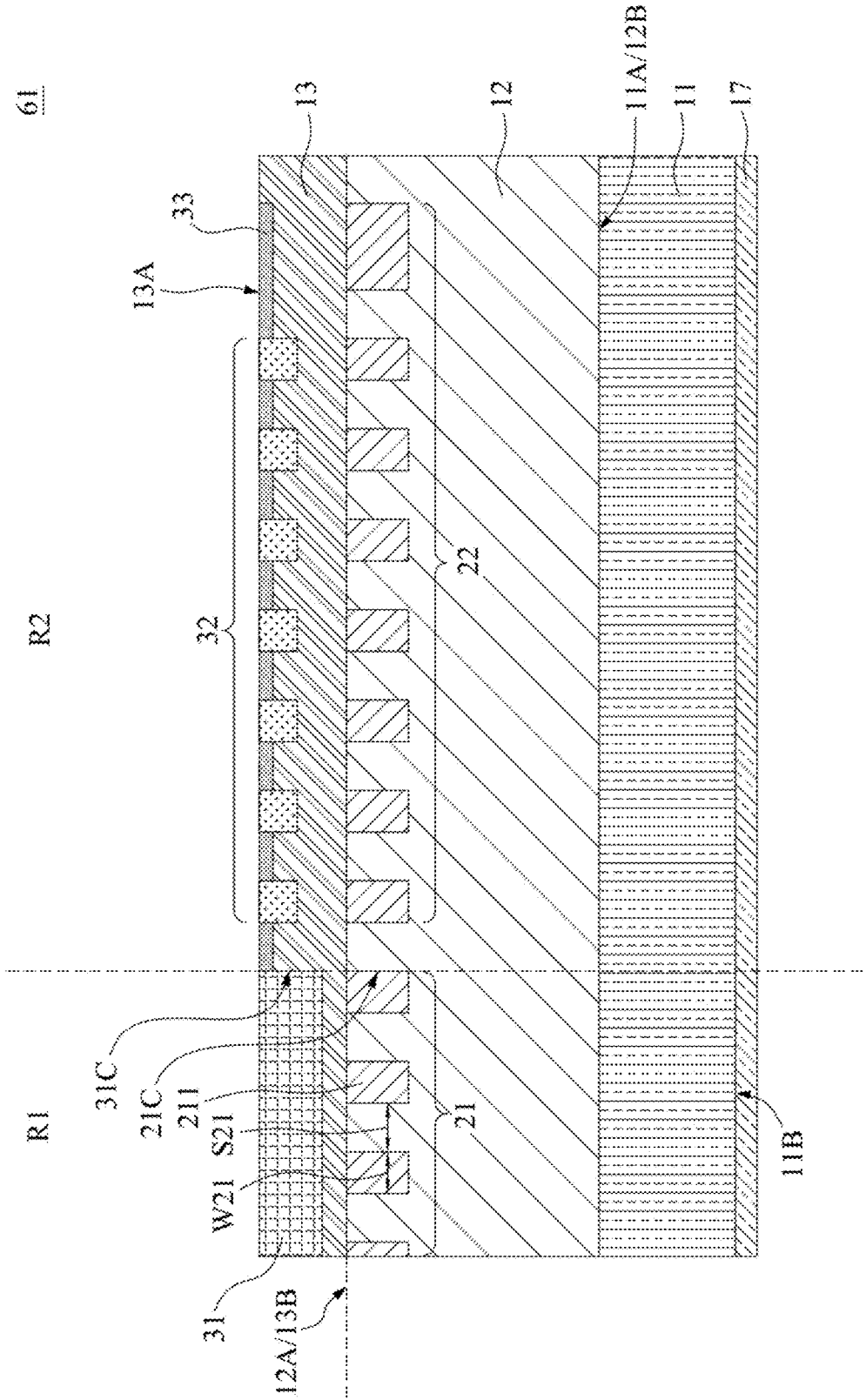
FIGS. 8, 9, 10, 11, 12, 13, 14, 15, 16, 17, 18, 19, 20 and 21 are example cross-sectional views of semiconductor structures according to various embodiments of the present disclosure.

FIG. 8 is a cross-sectional view of an example semiconductor structure 61 according to embodiments of the present disclosure. The difference between the semiconductor structure 61 and the semiconductor structure 60 is that, the transition guard ring structure 21 of the semiconductor structure 61 includes a plurality of transition guard ring well regions 211, instead of a single guard ring well region as included in the semiconductor structure 60. In some embodiments, the spacing S21 between adjacent transition guard ring well regions 211 may range from 0.1 m to 2 µm. In some embodiments, the width W21 of a single transition guard ring well region 211 may range from 0.1 µm to 3 µm. In some embodiments, the side edge 21C of a transition guard ring well region 211 that is the closest to the termination region R2 adjoins the termination region R2 and is aligned with the side edge 31C of the transition well region 31 above. The semiconductor structure 61 and the semiconductor structure 60 have the similar or same breakdown voltage.

Figure 9:
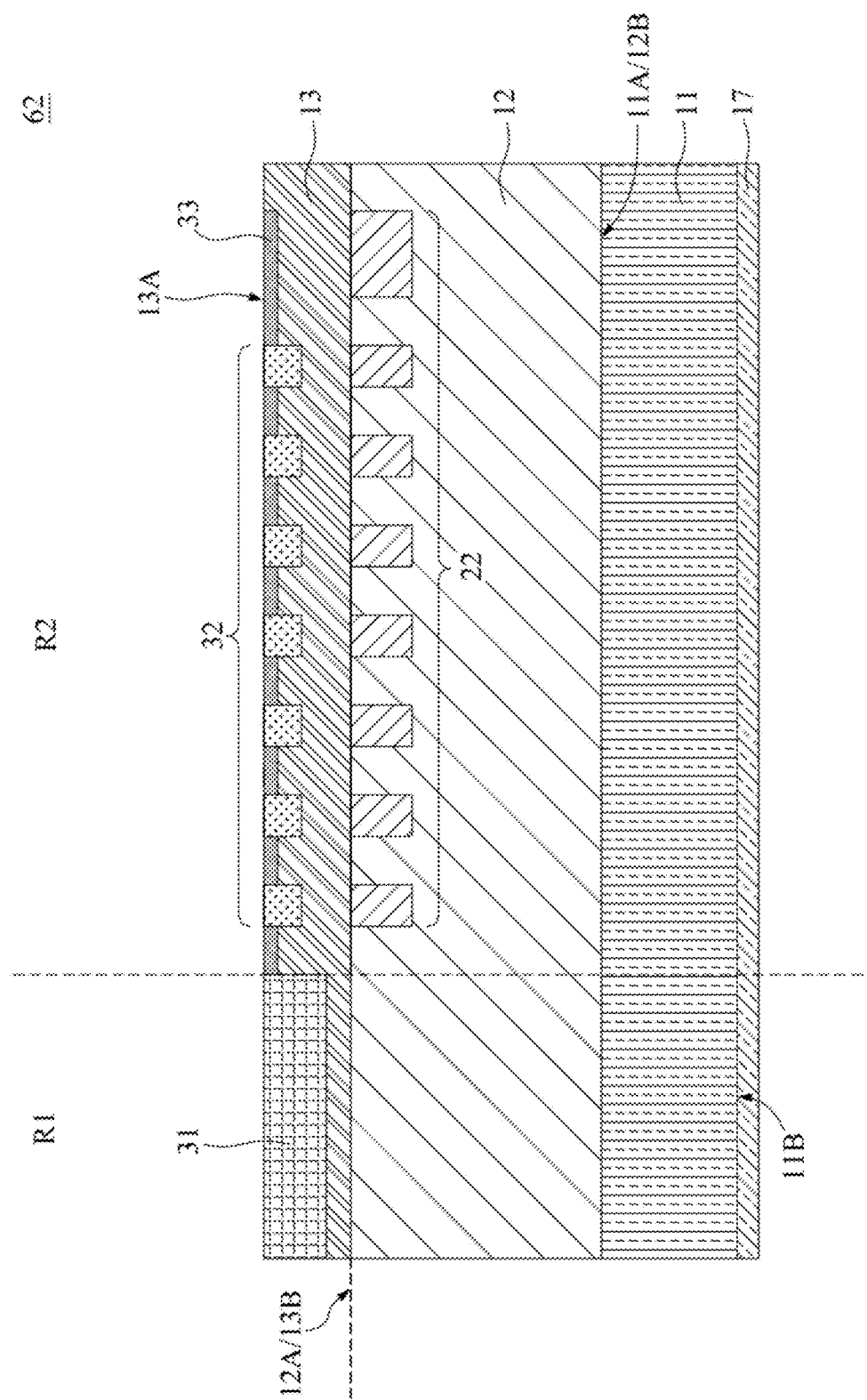

FIG. 9 is a cross-sectional view of an example semiconductor structure 62 according to embodiments of the present disclosure. The difference between the semiconductor structure 62 and the semiconductor structure 60 is that, the semiconductor structure 62 does not have the transition guard ring structure 21. As mentioned above, the transition guard ring structure 21 can push the e-peak into the interior of the unit region R1, which is beneficial to further increasing the breakdown voltage. The semiconductor structure 62 can effectively increase the breakdown voltage compared to the existing processes, however, the e-peak of the semiconductor structure 62 is closer to the termination region R2 than that of the semiconductor structure 60.

Figure 10:
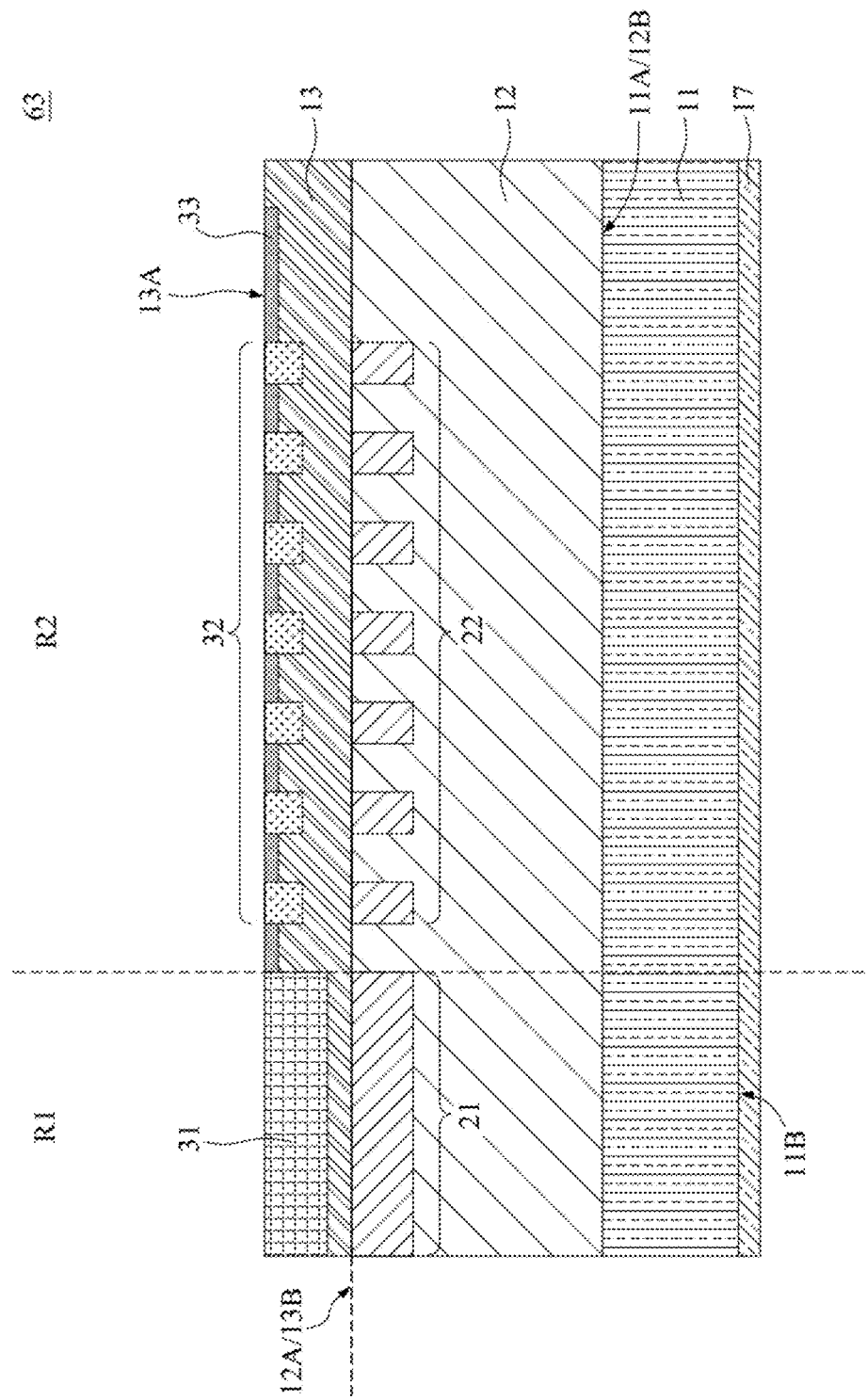

FIG. 10 is a cross-sectional view of an example semiconductor structure 63 according to embodiments of the present disclosure. The difference between the semiconductor structure 63 and the semiconductor structure 60 is that, the semiconductor structure 63 does not have the guard ring well region 222. As mentioned above, the guard ring well region 222 can push the depletion region outwardly, which increases the coverage of the depletion region without affecting the size of a semiconductor device, and further increases the breakdown voltage of the semiconductor device. Therefore, the semiconductor structure 63 can effectively increase the breakdown voltage compared to the existing processes, but has a smaller depletion region than the semiconductor structure 60.

Figure 11:
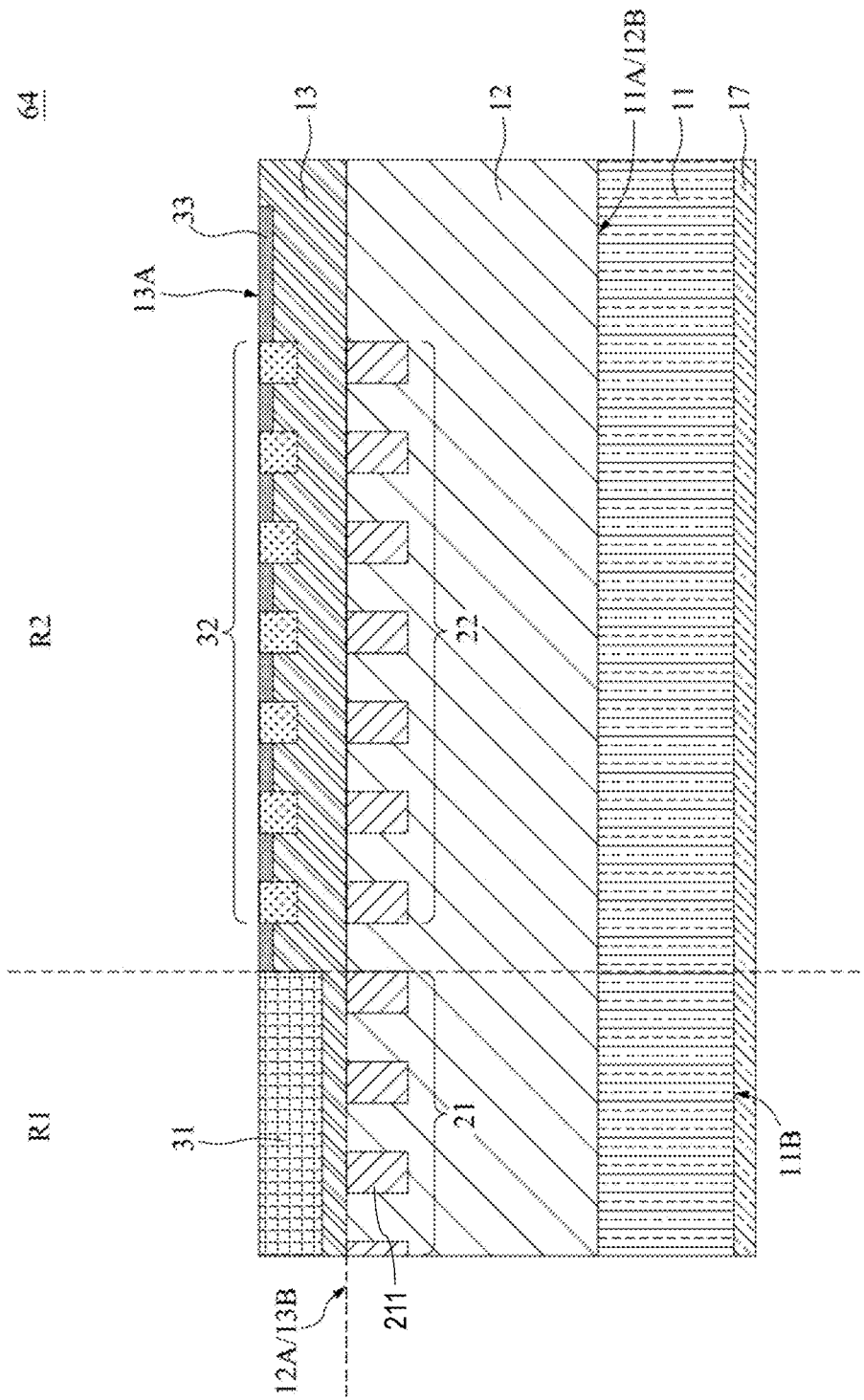

FIG. 11 is a cross-sectional view of an example semiconductor structure 64 according to embodiments of the present disclosure. The difference between the semiconductor structure 64 and the semiconductor structure 60 is that, the transition guard ring structure 21 of the semiconductor structure 64 includes a plurality of transition guard ring well regions 211 and does not have the guard ring well region 222. Similarly to those described above, the semiconductor structure 64 can effectively increase the breakdown voltage compared with the existing processes, but the depletion region of the semiconductor structure 64 is smaller than that of the semiconductor structure 60 or the semiconductor structure 63.

Figure 12:
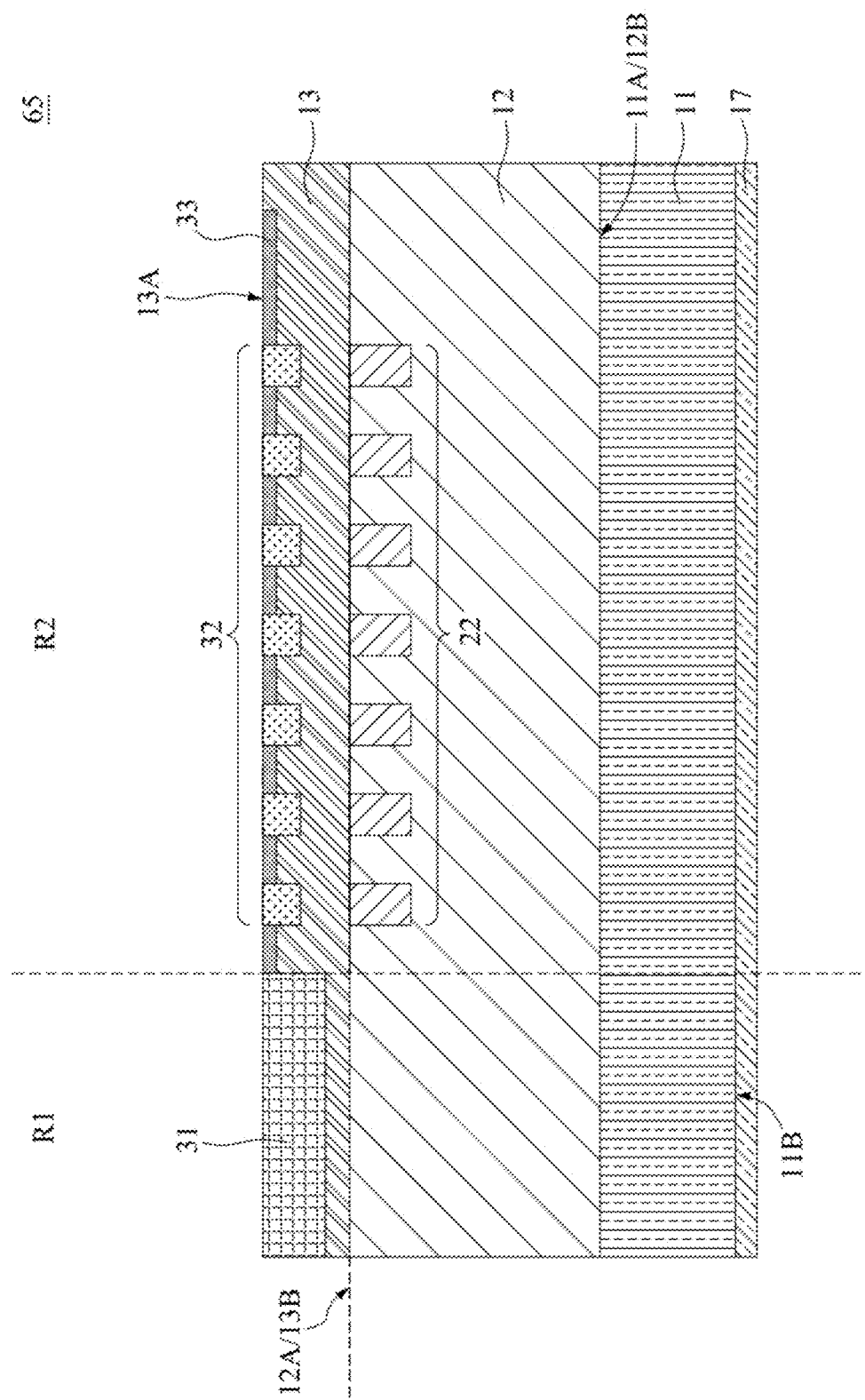

FIG. 12 is a cross-sectional view of an example semiconductor structure 65 according to embodiments of the present disclosure. The difference between the semiconductor structure 65 and the semiconductor structure 60 is that, the semiconductor structure 65 does not have the transition guard ring structure 21 and the guard ring well region 222. Similar to those described above, the semiconductor structure 65 can effectively increase the breakdown voltage compared with the existing processes. However, compared with the semiconductor structure 60, the depletion region of the semiconductor structure 65 is smaller, and the e-peak is closer to the termination region R2.

Figure 13:
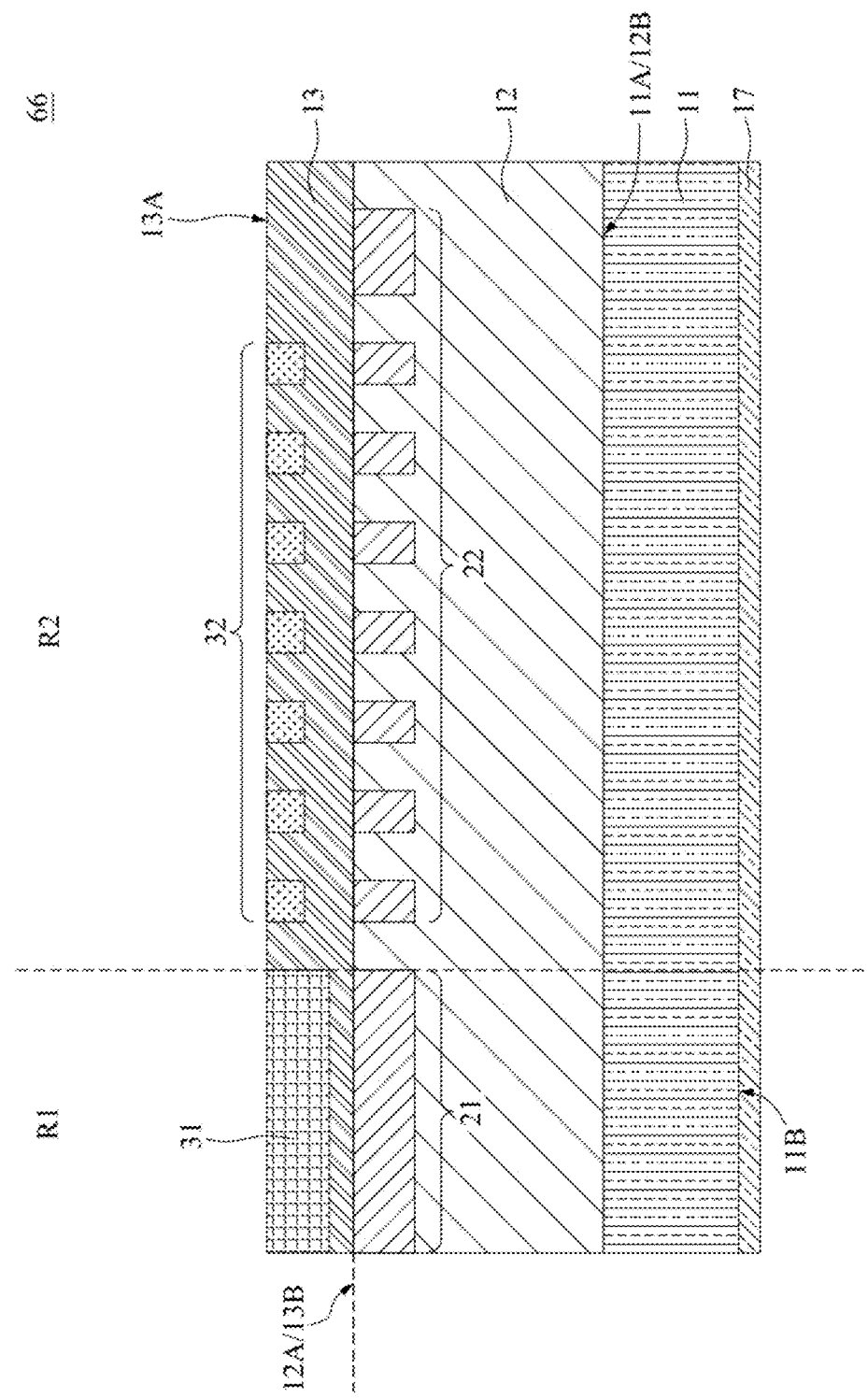

FIG. 13 is a cross-sectional view of an example semiconductor structure 66 according to embodiments of the present disclosure. The difference between the semiconductor structure 66 and the semiconductor structure 60 is that, the semiconductor structure 66 does not have the compensation well region 33. As mentioned above, the compensation well region 33 can reduce the sensitivity of the semiconductor structure 60 to surface charges, but under well-designed conditions, the double-layer guard ring structure can eliminate the problem of electron hitting. Therefore, the semiconductor structure 66 may have the same or approximately the same performance compared to the semiconductor structure 60. For the same reason, the semiconductor structures 61-65 may also optionally have the compensation well region 33.

Figure 14:
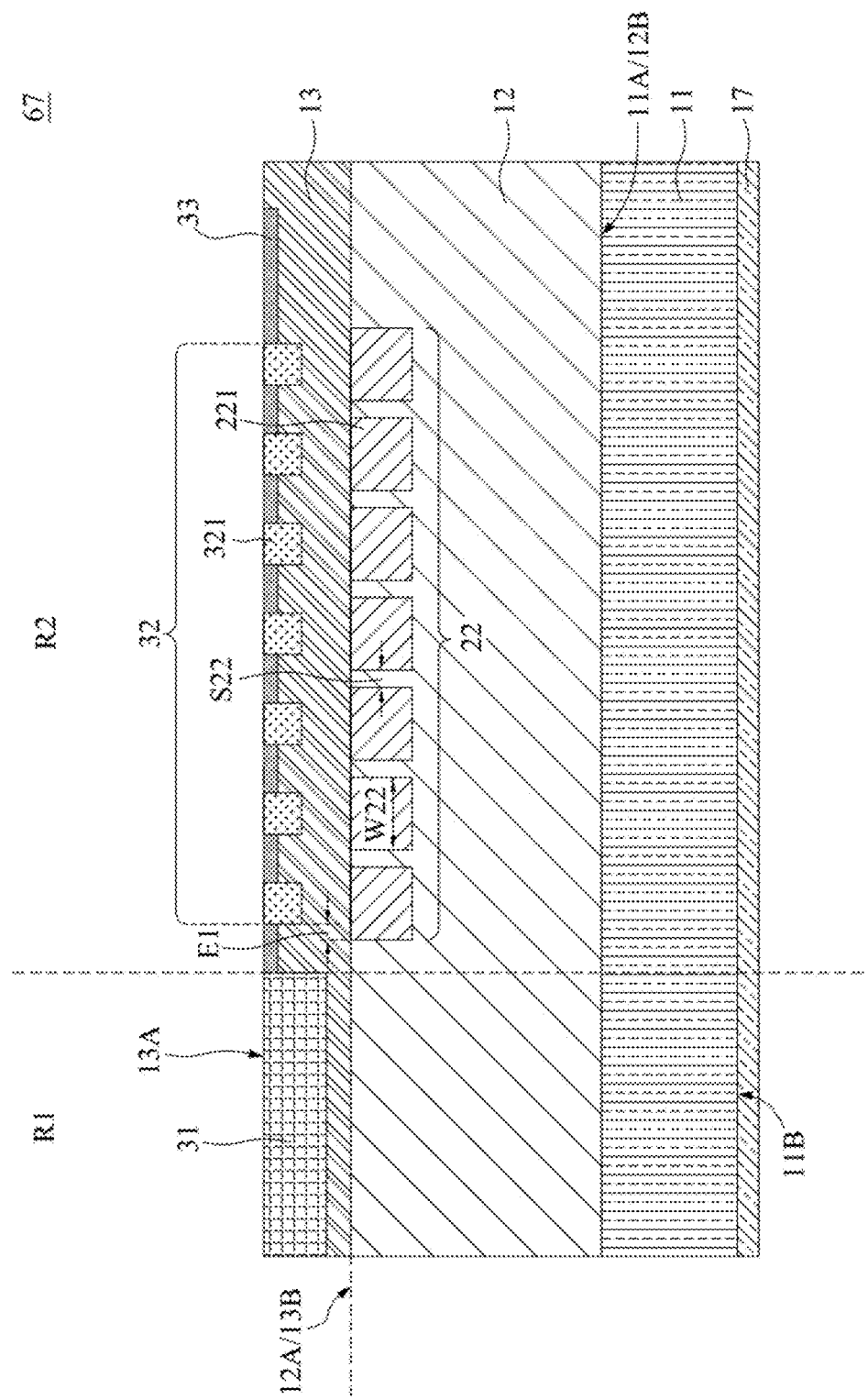

FIG. 14 is a cross-sectional view of an example semiconductor structure 67 according to embodiments of the present disclosure. The semiconductor structure 67 has a structure similar to the semiconductor structure 65. Compared with the semiconductor structure 65, the guard ring well regions 221 of the semiconductor structure 67 have a larger width and a smaller spacing. As mentioned above, the electric field may be particularly concentrated at the lower corners of a well region. Therefore, the corners of the guard ring well regions 321 of the shallow guard ring structure 32 need to be located within the coverage of the guard ring well regions 221 in the vertical direction. In some embodiments, a side edge of a guard ring well region 221 may protrude beyond a side edge of a guard ring well region 321. In some embodiments where the side edges of the guard ring well regions 221 are not aligned with the side edges of the guard ring well regions 321, the distance E1 between a side edge of a guard ring well region 221 and a side edge of a corresponding guard ring well region 321 above in the horizontal direction may be between 0.1 μm and 2 μm. The semiconductor structures 67 may have performance the same as or similar to the semiconductor structure 65.

Figure 15:
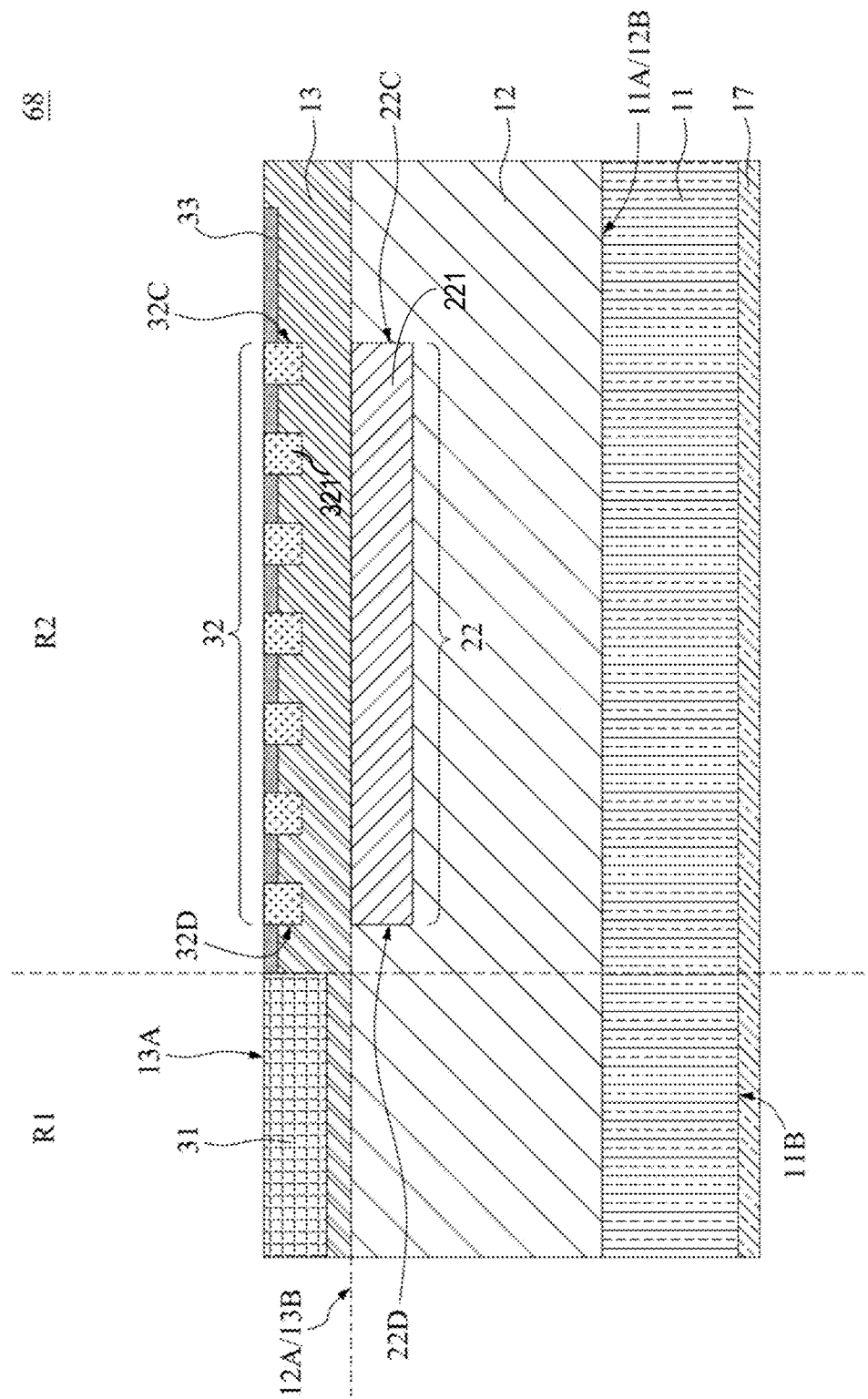

FIG. 15 is a cross-sectional view of an example semiconductor structure 68 according to embodiments of the present disclosure. The semiconductor structure 68 has a structure similar to the semiconductor structure 67. The difference between the semiconductor structure 68 and the semiconductor structure 67 is that, the deep guard ring structure 22 of the semiconductor structure 68 has a single guard ring well region 221 that overlaps the entire shallow guard ring structure 32 below the shallow guard ring structure 32. In some embodiments, the side edge 22D of a guard ring well region 221 and adjacent to the unit region R1 is aligned with the side edge 32D of a guard ring well region 321 and adjacent to the unit region R1, where the guard ring well region 321 is the closest to the unit region R1 among the plurality of guard ring well regions 321. In some embodiments, the side edge 22C of the guard ring well region 221 and away from the unit region R1 is aligned with the side edge 32C of a guard ring well region 321 farthest away from the unit region R1. The semiconductor structure 68 may have performance the same as or similar to the semiconductor structure 67.

Figure 16:
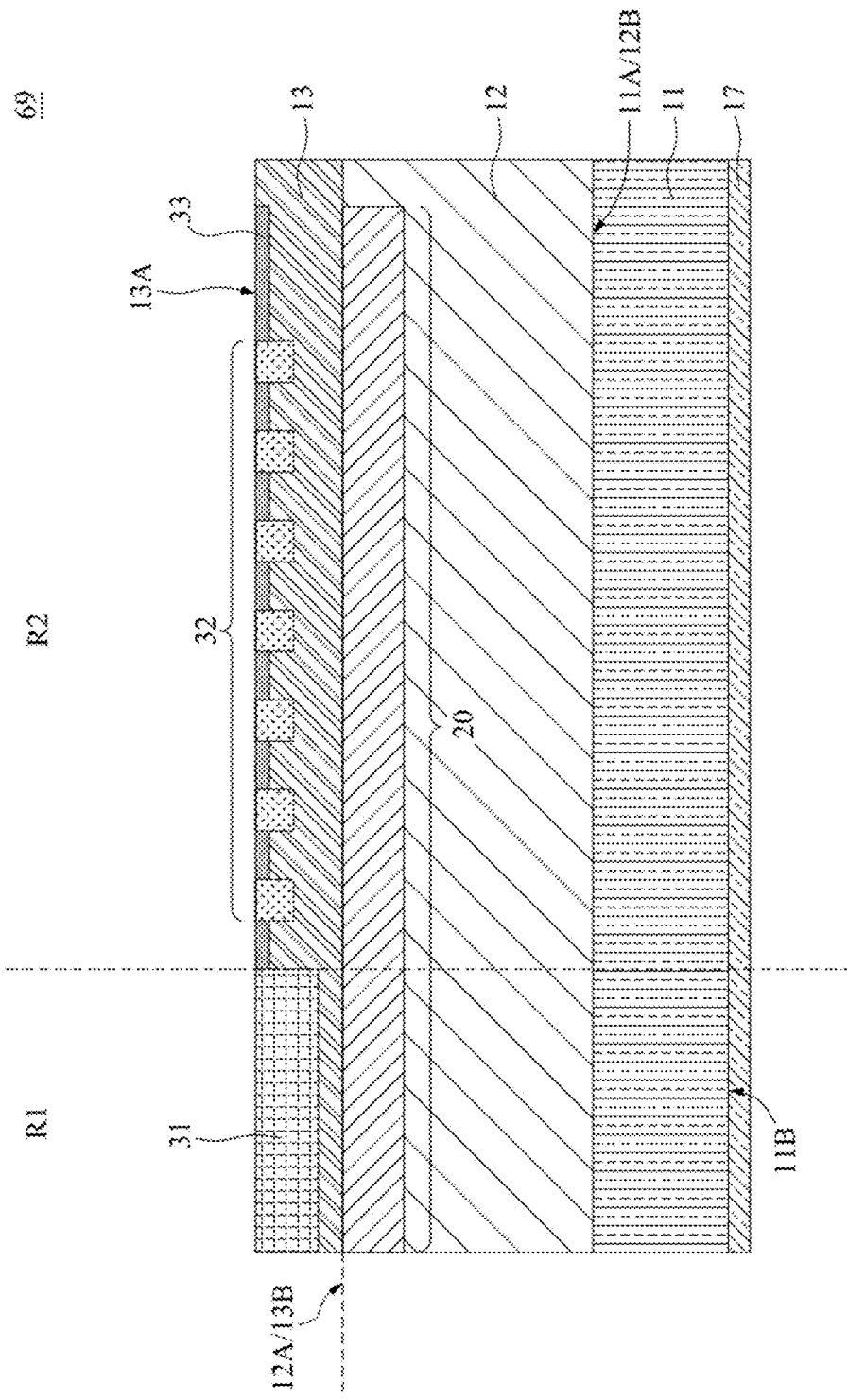

FIG. 16 is a cross-sectional view of an example semiconductor structure 69 according to embodiments of the present disclosure. The difference between the semiconductor structure 69 and the semiconductor structure 60 is that, the transition guard ring structure 21 and the deep guard ring structure 22 of the semiconductor structure 69 are in contact with and connected to each other, forming a deep well region 20 overlapping and below the transition well region 31, the shallow guard ring structure 32 and the compensation well region 33. The semiconductor structure 69 and the semiconductor structure 60 have similar or same performance.

Figure 17:
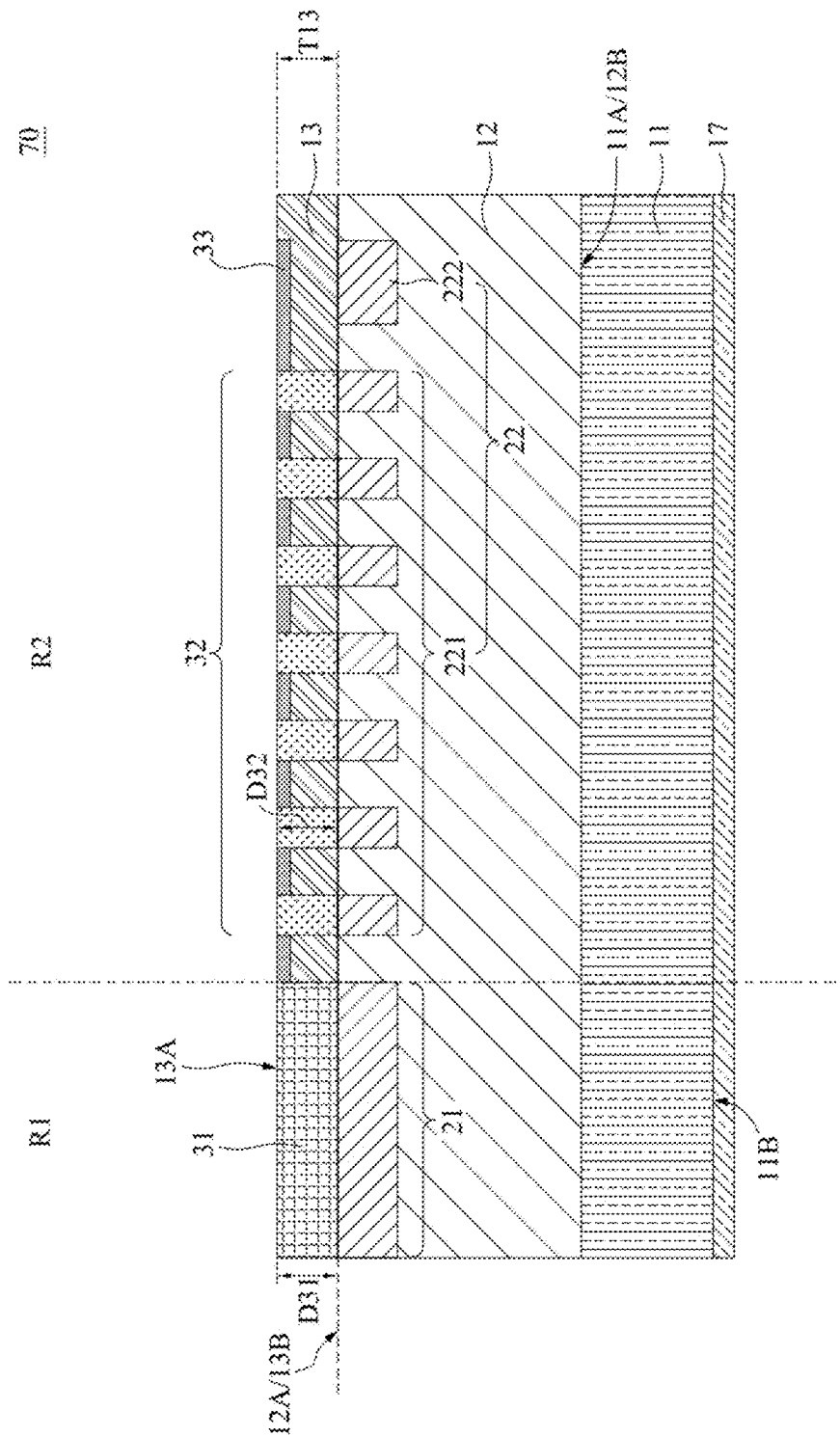

FIG. 17 is a cross-sectional view of an example semiconductor structure 70 according to embodiments of the present disclosure. The difference between the semiconductor structure 70 and the semiconductor structure 60 is that, the top of the transition guard ring structure 21 of the semiconductor structure 70 is in contact with the bottom of the transition well region 31 above, and the top of the guard ring well regions 221 of the deep guard ring well region 22 is in contact with the bottom of the guard ring well regions 321 of the shallow guard ring structure 32 above. As mentioned above, the thickness T13 of the second silicon carbide layer 13, the depth D31 of the transition well region 31, and the depth D32 of the guard ring well regions 321 may be adjusted according to different processes or different needs. In some embodiments, the thickness T13 of the second silicon carbide layer 13, the depth D31 of the transition well region 31 and the depth D32 of the guard ring well regions 321 may be approximately the same. In some embodiments, the transition well region 31 may end on the surface 13B of the second silicon carbide layer 13, and the guard ring well regions 321 may end on the surface 13B of the second silicon carbide layer 13. In some embodiments, the transition well region 31 may be in contact with the surface 12A of the first silicon carbide layer 12, and the guard ring well regions 321 may be in contact with the surface 12A of the first silicon carbide layer 12. Depending on the depth (distance) from the bottom of the deep guard ring structure 22 to the surface 13A of the second silicon carbide layer 13 (that is, based on the depth at which the e-peak is moved downwardly), the semiconductor structure 70 may have performance the same as or similar to the semiconductor structure 60.

In some embodiments, when the thickness T13 of the second silicon carbide layer 13 is less than an originally designed depth of the body doping region in the unit region R1, the depth of the body doping region in the unit region R1 may be designed to be less than, equal to or greater than the thickness T13 of the second silicon carbide layer 13. Since there may be an interface between the first silicon carbide layer 12 and the second silicon carbide layer 13, and considering the process difficulty and cost, the depth of the body doping region in the unit region R1 may be designed to be less than or equal to the thickness T13 of the second silicon carbide layer 13. When considering the need of maintaining the originally designed product performance, the depth of the body doped region in the unit region R1 may be greater than the thickness T13 of the second silicon carbide layer 13. Therefore, the manufacturing method provided by the embodiments of the present disclosure can be well integrated with the existing processes without the need of significant modifications.

Figure 18:
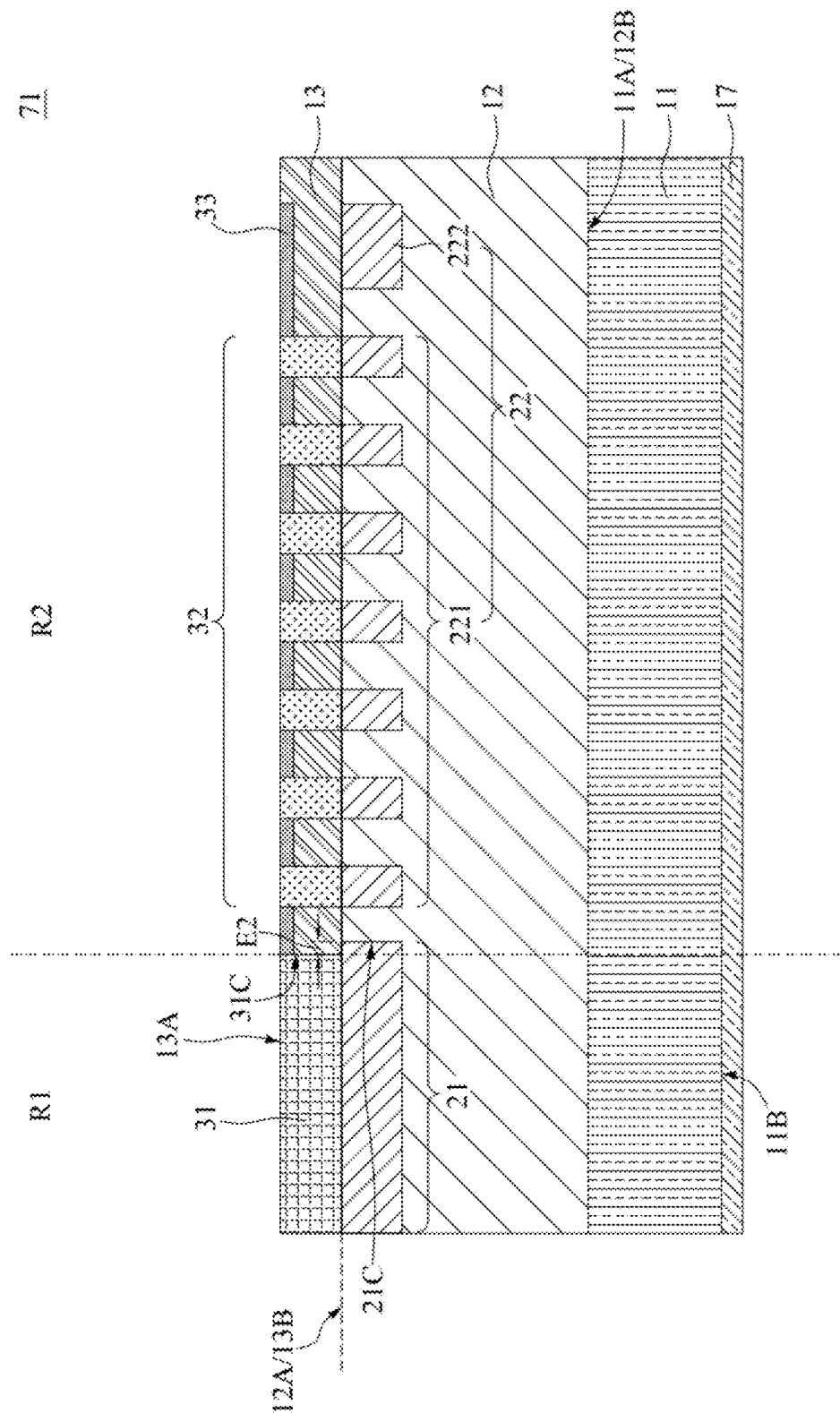

FIG. 18 is a cross-sectional view of an example semiconductor structure 71 according to embodiments of the present disclosure. The semiconductor structure 71 has a structure similar to the semiconductor structure 70. Compared with the semiconductor structure 70, the transition guard ring structure 21 of the semiconductor structure 71 protrudes toward the termination region R2 in the horizontal direction in relation to the transition well region 31 above. In some embodiments, part of the transition guard ring structure 21 may be located in the termination region R2. In some embodiments, the transition guard ring structure 21 may have a single transition guard ring well region 211, and its side edge 21C protrudes beyond the position of the side edge 31C that is of the transition well region 31 and that is adjacent to the termination region R2. In some embodiments, the distance E2 in the horizontal direction between the side edge 21C of the transition guard ring well region 211 and the side edge 31C of the transition well region 31 above may be in the range of 0.1-2 μm. In some embodiments, the horizontal distance E2 between the side edge 21C, which is of the transition guard ring well region 211 and is adjacent to the interface between the termination region R2 and the unit region R1, and the interface between the termination region R2 and the unit region R1, is in the range of 0.1-2 μm. The semiconductor structure 71 may have performance the same as or similar to the semiconductor structure 70.

Figure 19:
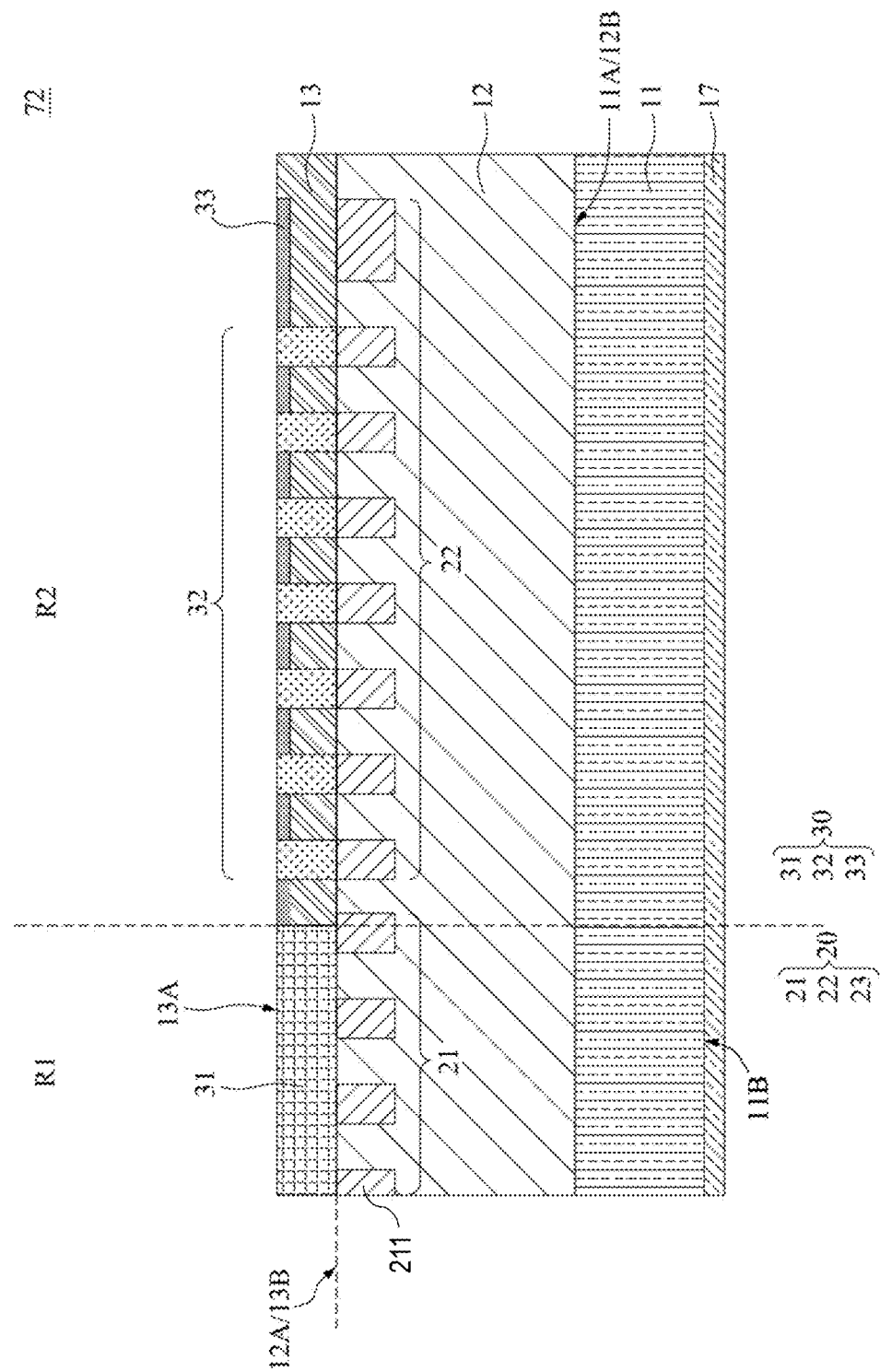

FIG. 19 is a cross-sectional view of an example semiconductor structure 72 according to embodiments of the present disclosure. The semiconductor structure 72 has a structure similar to the semiconductor structure 71. The difference between the semiconductor structure 72 and the semiconductor structure 71 is that, the transition guard ring structure 21 of the semiconductor structure 71 has a plurality of transition guard ring well regions 211. In some embodiments, a portion of a transition guard ring well region 211, which is of the transition guard ring structure 21 and is closest to the termination region R2, may be located in the termination region R2. The semiconductor structure 72 may have performance the same as or similar to the semiconductor structure 71.

Figure 20:
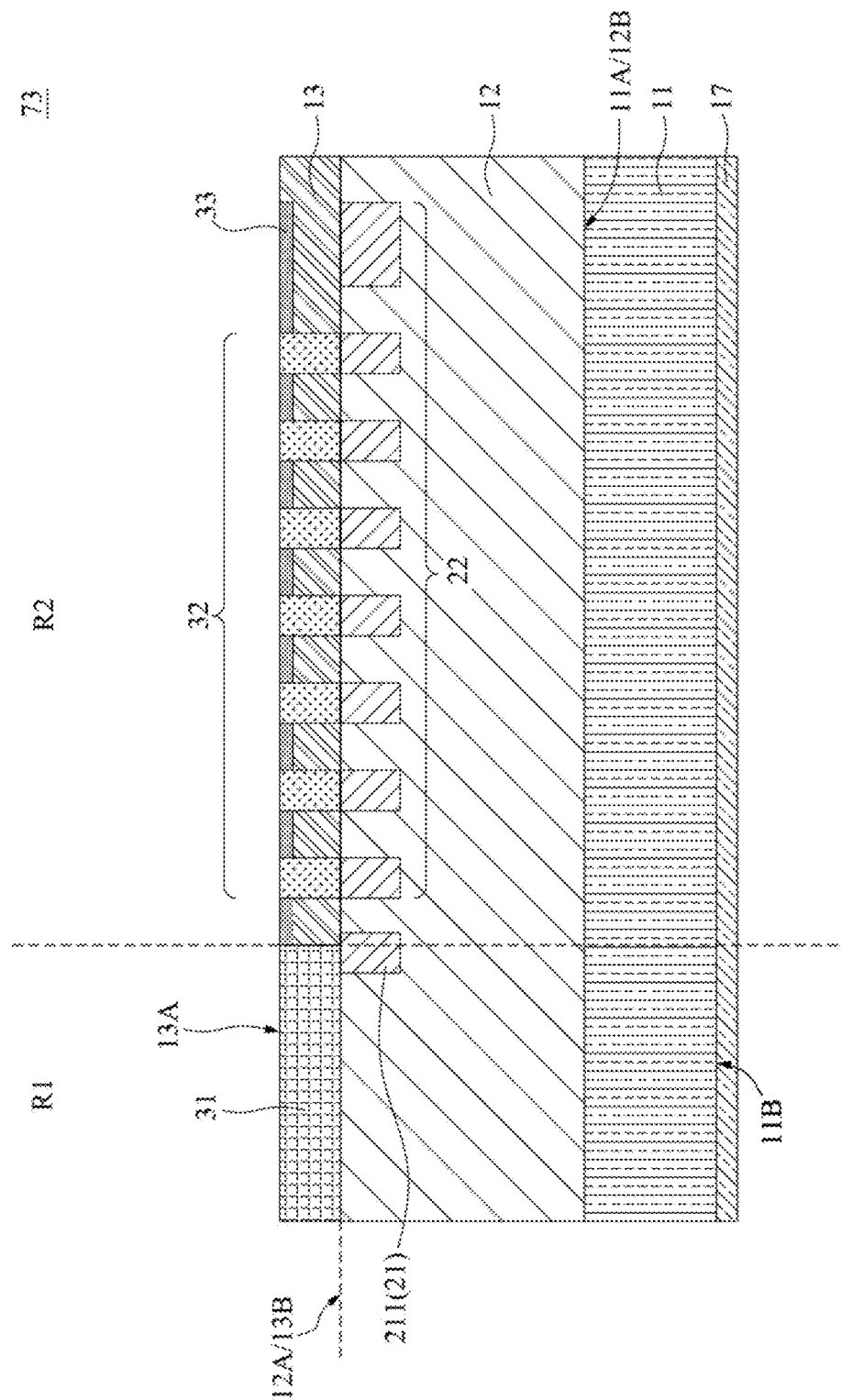

FIG. 20 is a cross-sectional view of an example semiconductor structure 73 according to embodiments of the present disclosure. The semiconductor structure 73 has a similar structure to the semiconductor structure 72. The difference between the semiconductor structure 73 and the semiconductor structure 72 is that, the transition guard ring structure 21 of the semiconductor structure 73 only has the transition guard ring well region 211 that is closest to the termination region R2 in the semiconductor structure 72, without having other transition guard ring well regions 211 shown in the semiconductor structure 72. As mentioned above, the purpose of the transition guard ring structure 21 is to move the e-peak concentrated at the corners of the transition well region 31 toward the inside of the unit region R1. Therefore, except for transition guard ring well region 211 overlapping the corners of the transition well region 31, other transition guard ring well region(s) 211 does/do not contribute significantly to moving the e-peak toward the interior of the unit region R1. The semiconductor structure 73 may have performance the same as or similar to the semiconductor structure 71.

Figure 21:
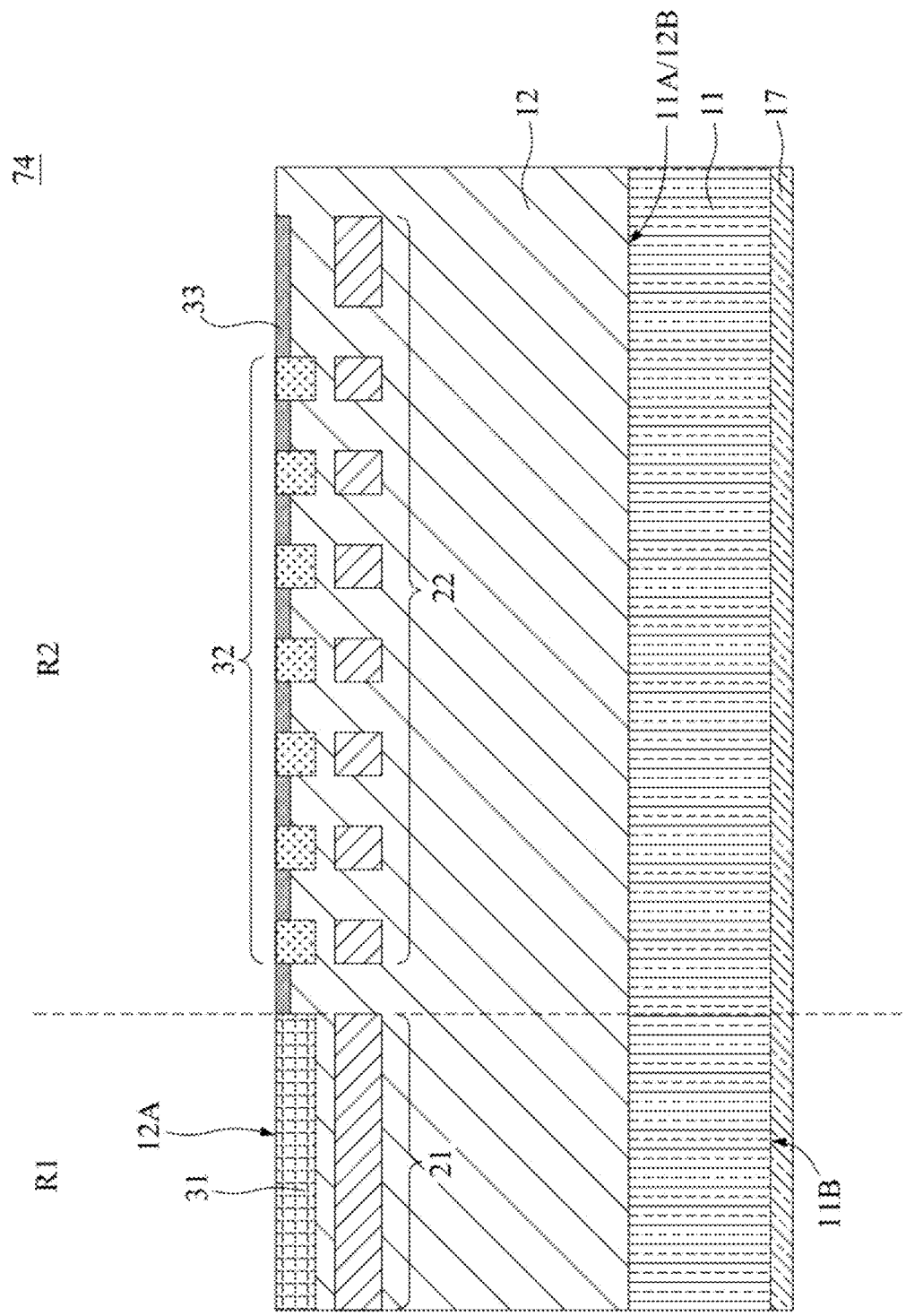

FIG. 21 is a cross-sectional view of an example semiconductor structure 74 according to embodiments of the present disclosure. The difference between the semiconductor structure 74 and the semiconductor structure 60 is that, the semiconductor structure 74 does not have the second silicon carbide layer 13. In the embodiment without the second silicon carbide layer 13, the guard ring structure 32, the transition well region 31 and the compensation well region 33 are formed on the surface 12A of the first silicon carbide layer 12; and the transition guard ring structure 21 and the deep guard ring structure 22 are formed below the guard ring structure 32 and the transition well region 31. In the embodiment shown in FIG. 21, the guard ring structure 32 and the transition well region 31 may be respectively separated from the transition guard ring structure 21 and the deep guard ring structure 22 below. In some embodiments, similar to the embodiments illustrated in FIGS. 17-20, the guard ring structure 32 and the transition well region 31 may be respectively in contact with the transition guard ring structure 21 and the deep guard ring structure 22 below. As mentioned above, due to the material characteristics of silicon carbide, which makes it difficult for ions to diffuse, and coupled with the limitations of existing processes and equipment, the depth of a well region formed by ion implantation from the top surface downwardly generally does not exceed 3 µm. Therefore, the depths of the transition guard ring structure 21 and the deep guard ring structure 22 of the semiconductor structure 74 may be limited to a range of less than or equal to 3 µm, which means that the e-peak can be moved downwardly in a limited range. With the advancement of technologies and processes, the depths of the transition guard ring structure 21 and the deep guard ring structure 22 may be greater than 3 µm, and the semiconductor structure 74 may have performance the same as or similar to the semiconductor structure 60.

Figure 22:
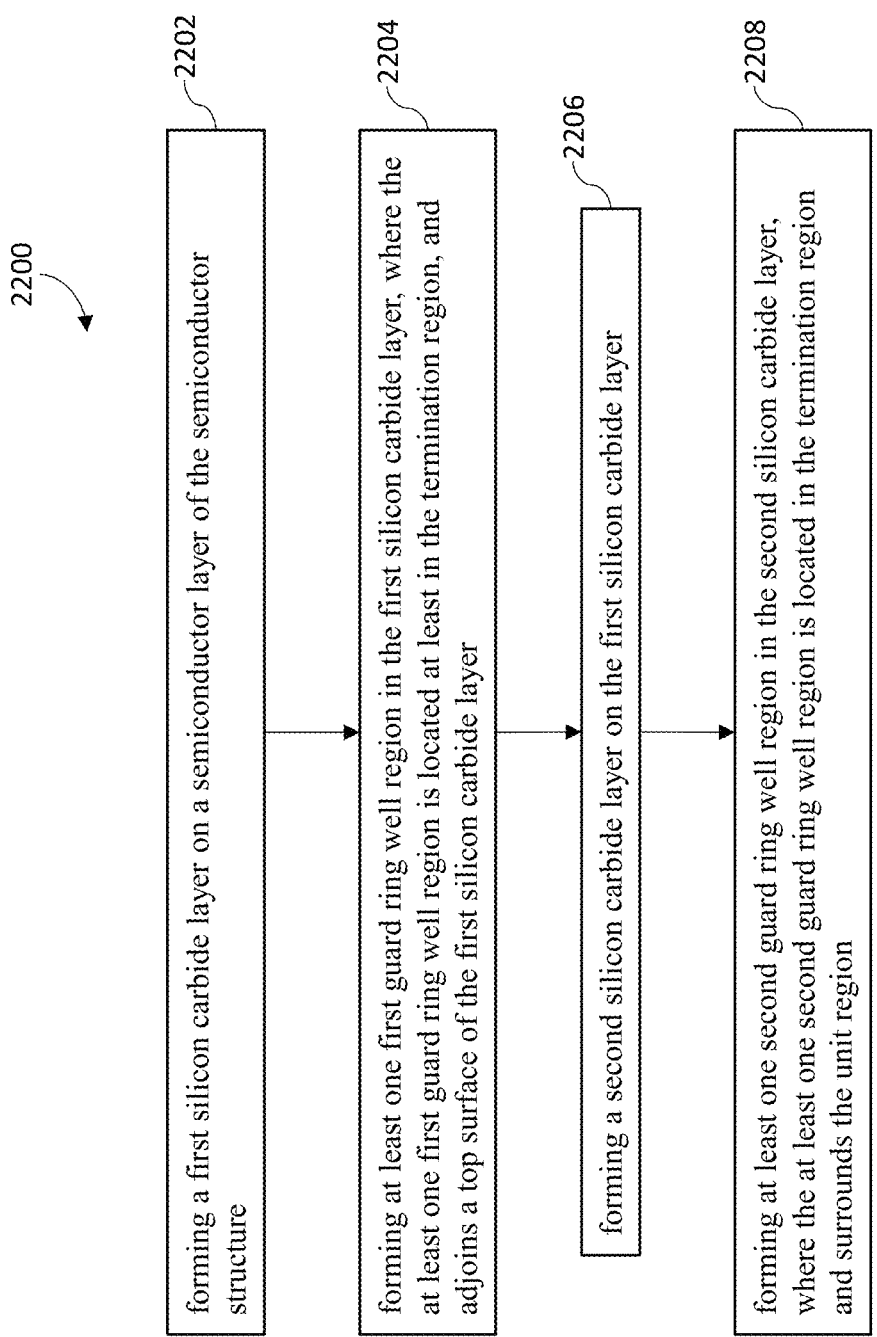
FIG. 22 is a flowchart of an example method for manufacturing a semiconductor structure according to embodiments of the present disclosure.

FIG. 22 is a flowchart of an example method 2200 for manufacturing a semiconductor structure according to embodiments of the present disclosure. The semiconductor structure may be any of the embodiment semiconductor structures described above. the semiconductor structure includes a unit region and a termination region surrounding the unit region. As shown, the method 2200 may include forming a first silicon carbide layer on a semiconductor layer of the semiconductor structure (block 2202). The method 2200 may further include forming at least one first guard ring well region in the first silicon carbide layer, where the at least one first guard ring well region is located at least in the termination region, and adjoins a top surface of the first silicon carbide layer (block 2204). The method 2200 may further include forming a second silicon carbide layer on the first silicon carbide layer (block 2206). The method 2200 may also include forming at least one second guard ring well region in the second silicon carbide layer, where the at least one second guard ring well region is located in the termination region and surrounds the unit region (block 2208). The at least one second guard ring well region may be located within a coverage of a vertical projection of the at least one first guard ring well region, and the at least one second guard ring well region adjoins a top surface of the second silicon carbide layer. The method 2200 may also include other steps as described in embodiments above.

The following embodiments are further provided.

Embodiment 1, a semiconductor structure includes: a silicon carbide layer divided into a unit region and a termination region surrounding the unit region; a first guard ring structure in the termination region of the silicon carbide layer, the first guard ring structure adjoining a top surface of the silicon carbide layer, and including at least one first guard ring well region; and a second guard ring structure in the silicon carbide layer and below the first guard ring structure, the second guard ring structure being separated from the top of the silicon carbide layer, and the second guard ring structure including at least one second guard ring well region corresponding to the at least one first guard ring well region in a vertical direction.

Embodiment 2, the semiconductor structure of embodiment 1, wherein the silicon carbide layer further includes a transition well region located in the unit region, and adjoining the termination region; and the semiconductor structure further includes a third guard ring structure in the unit region of the silicon carbide layer and below the transition well region.

Embodiment 3, the semiconductor structure of embodiment 2, wherein the third guard ring structure includes a plurality of guard ring well regions disposed below the transition well region, and separated from each other.

Embodiment 4, the semiconductor structure of embodiment 2, wherein a side edge of the transition well region and adjacent to the termination region overlaps a top of the third guard ring structure in the vertical direction.

Embodiment 5, the semiconductor structure of embodiment 2, wherein a side edge of the third guard ring structure adjacent to the termination region is aligned with a side edge of the transition well region adjacent to the termination region.

Embodiment 6, the semiconductor structure of embodiment 1, wherein a distance from a top of the second guard ring structure to a bottom of the first guard ring structure in the vertical direction is in a range of 0-3 micrometer (µm).

Embodiment 7, the semiconductor structure of embodiment 1, wherein the second guard ring structure further includes: a third guard ring well region located in the termination region of the silicon carbide layer and surrounding the at least one second guard ring well region, an elevation height of the third guard ring well region being about same as that of the at least one second guard ring well region, and the third guard ring well region surrounding the first guard ring structure when being viewed in a top view of the semiconductor structure.

Embodiment 8, the semiconductor structure of embodiment 1, wherein the first guard ring structure and the second guard ring structure have a same conductivity type, and the first guard ring structure has a doping concentration that is greater than that of the second guard ring structure.

Embodiment 9, the semiconductor structure of embodiment 1 further includes: a compensation well region located in the termination region of the silicon carbide layer and adjoining the top surface of the silicon carbide layer, a depth of the compensation well region being less than that of the first guard ring structure, and the first guard ring structure being within a coverage of the compensation well region when being viewed from a top view of the semiconductor structure.

Embodiment 10, the semiconductor structure of embodiment 9, wherein the compensation well region has a conductivity type same as that of the first guard ring structure, and the compensation well region has a doping concentration that is smaller than that of the first guard ring structure or the second guard ring structure.

Embodiment 11, the semiconductor structure of embodiment 9, wherein the second guard ring structure further includes: a third guard ring well region located in the termination region of the silicon carbide layer and surrounding the at least one second guard ring well region, the third guard ring well region being not overlapping the first guard ring structure, the third guard ring well region being away from a side edge of the unit region, and being aligned in the vertical direction with a side edge of the compensation well region that is away from the unit region.

Embodiment 12, the semiconductor structure of embodiment 1, wherein the first guard ring structure includes a plurality of first guard ring well regions separated from each other, the second guard ring structure includes a plurality of second guard ring well regions separated from each other, and the plurality of second guard ring well regions respectively overlap the plurality of first guard ring well regions in the vertical direction.

Embodiment 13, the semiconductor structure of embodiment 12, wherein each of the plurality of first guard ring well regions is located within a coverage of a vertical projection of a corresponding second guard ring well region, and a distance from a side edge of a first guard ring well region to a side edge of the corresponding second guard ring well region along a horizontal direction is in a range of 0-2 μm.

Embodiment 14, the semiconductor structure of embodiment 1, wherein the second guard ring structure is a single doped region, and the first guard ring structure is located within a coverage of a vertical projection of the single doped region.

Embodiment 15, the semiconductor structure of embodiment 14, wherein the single doped region extends below a transition well region that is in the unit region of the silicon carbide layer and that adjoins the termination region.

Embodiment 16, the semiconductor structure of embodiment 1, wherein the silicon carbide layer includes a first silicon carbide layer, and a second silicon carbide layer below the first silicon carbide layer; the first guard ring structure is located in the first silicon carbide layer and adjoins a top surface of the first silicon carbide layer, and the second guard ring structure is located in the second silicon carbide layer, and adjoins a top surface of the second silicon carbide layer.

Embodiment 17, a method for manufacturing a semiconductor structure includes: forming a first silicon carbide layer on a semiconductor layer of the semiconductor structure, the semiconductor structure comprising a unit region and a termination region surrounding the unit region; forming at least one first guard ring well region in the first silicon carbide layer, the at least one first guard ring well region being located at least in the termination region, and adjoining a top surface of the first silicon carbide layer; after forming the at least one first guard ring well region, forming a second silicon carbide layer on the first silicon carbide layer; and forming at least one second guard ring well region in the second silicon carbide layer, the at least one second guard ring well region being located in the termination region and surrounding the unit region, the at least one second guard ring well region being located within a coverage of a vertical projection of the at least one first guard ring well region, and the at least one second guard ring well region adjoining a top surface of the second silicon carbide layer.

Embodiment 18, the method of embodiment 17 further includes: before forming the second silicon carbide layer, performing a thermal annealing process to the first silicon carbide layer.

Embodiment 19, the method of embodiment 17 further includes: forming an oxide layer on the second silicon carbide layer, with the oxide layer in contact with the top surface of the second silicon carbide layer.

Embodiment 20, the method of embodiment 17 further includes: forming a compensation well region in the termination region, the compensation well region having a doping concentration less than that of the at least one first guard ring well region or the at least one second guard ring well region, and the compensation well region having a depth smaller than that of the at least one second guard ring well.

Embodiment 21, the method of embodiment 17, wherein a thickness of the second silicon carbide layer is greater than that of the at least one second guard ring well.

Embodiment 22, the method of embodiment 17 further includes: forming a transition well region in the unit region of the second silicon carbide layer that adjoins the termination region.

Embodiment 23, the method of embodiment 17, wherein a side edge of the transition well region that adjoins the termination region is within a coverage range of a vertical projection of the at least one first guard ring well region.

Embodiment 24, the method of embodiment 17 further includes: introducing doping ions of a first-type during formation of the first silicon carbide layer, to form the first silicon carbide layer having a first conductivity type; and introducing doping ions of the first-type during formation of the second silicon carbide layer, to form the second silicon carbide layer having the first conductivity type, the second silicon carbide layer has a doping concentration of the first-type greater than that of the first silicon carbide layer.

In this disclosure, for description convenience, spatially relative terms such as "below", "under", "lower", "above", "upper", "left side", "right side", and so on, may be used to describe the relationship of one component or feature with another one or more components or features, as shown in the accompanying drawings. The spatially relative terms are not only used to depict the orientations in the accompanying drawings, but also intended to encompass different orientations of a device in use or operation. A device may be oriented in other ways (e.g., rotated 90 degrees or in other orientations), and the spatially relative terms used herein may be interpreted in a corresponding way similarly. It should be understood that when a component is referred to as being "connected" or "coupled" to another component, it can be directly connected or coupled to another component or an intervening component may be present.

As used herein, the terms "approximately", "basically", "substantially" and "about" are used to describe and account for small variations. When used in conjunction with an event or instance, the terms may refer to an embodiment of exact occurrence of an event or instance as well as an embodiment where the event or instance is close to the occurrence. As used herein with respect to a given value or range, the term "about" generally means being within ±10%, ±5%, ±1%, or ±0.5% of the given value or range. A range herein may be referred to as being from one endpoint to the other or as being between two endpoints. All ranges disclosed herein are inclusive of the endpoints unless otherwise indicated. The term "substantially coplanar" may mean that the difference of positions of two surfaces with reference to the same plane is within a few micrometers (m), e.g., within 10 μm, within 5 μm, within 1 μm, or within 0.5 μm. When values or characteristics are referred to as being "substantially" the same, the term may refer to a value that is within ±10%, ±5%, ±1%, or ±0.5% of the mean of the values.

The foregoing has outlined features of some embodiments and detailed aspects of present disclosure. The embodiments described in the present disclosure may be readily used as a basis for designing or modifying other processes and structures in order to carry out the same or similar purposes and/or to achieve the same or similar advantages of the embodiments presented herein. Such equivalent constructions do not depart from the spirit and scope of the present disclosure, and various changes, substitutions, and alterations can be made without departing from the spirit and scope of the present disclosure.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A semiconductor structure comprising:
   a silicon carbide layer comprising a unit region and a termination region surrounding the unit region;
   a first guard ring structure in the termination region of the silicon carbide layer, the first guard ring structure adjoining a top surface of the silicon carbide layer, and including at least one first guard ring well region;
   a second guard ring structure in the silicon carbide layer and below the first guard ring structure, the second guard ring structure including at least one second guard ring well region corresponding to the at least one first guard ring well region in a vertical direction; and
   a third guard ring structure in the unit region of the silicon carbide layer, the third guard ring structure being lower than the first guard ring structure in the vertical direction.

2. The semiconductor structure of claim 1, further comprising:
   a transition well region in the unit region of the silicon carbide layer, the transition well region adjoining the termination region, and
   above the third guard ring structure in the unit region of the silicon carbide layer.

3. The semiconductor structure of claim 2, wherein the third guard ring structure includes a plurality of guard ring well regions disposed below the transition well region, the plurality of guard ring well regions being separated from each other.

4. The semiconductor structure of claim 2, wherein a position of a side edge of the transition well region overlaps with a top of the third guard ring structure in the vertical direction, the side edge being adjacent to the termination region.

5. The semiconductor structure of claim 2, wherein a first side edge of the third guard ring structure is aligned with a second side edge of the transition well region, the first side edge and the second side edge being adjacent to the termination region.

6. The semiconductor structure of claim 1, wherein a distance from a top of the second guard ring structure to a bottom of the first guard ring structure in the vertical direction is in a range of 0-3 micrometer (μm).

7. The semiconductor structure of claim 1, wherein the second guard ring structure further comprises:
   a third guard ring well region located in the termination region of the silicon carbide layer and surrounding the at least one second guard ring well region, a depth of the third guard ring well region being about same as that of the at least one second guard ring well region, and the third guard ring well region surrounding the first guard ring structure in a top view of the semiconductor structure.

8. The semiconductor structure of claim 1, wherein the first guard ring structure and the second guard ring structure have a same conductivity type, and the first guard ring structure has a doping concentration that is greater than that of the second guard ring structure.

9. The semiconductor structure of claim 1, further comprising:
   a compensation well region located in the termination region of the silicon carbide layer and adjoining the top surface of the silicon carbide layer, a depth of the compensation well region being less than that of the first guard ring structure, and the first guard ring structure being within a coverage of the compensation well region in a top view of the semiconductor structure.

10. The semiconductor structure of claim 9, wherein the compensation well region has a conductivity type same as that of the first guard ring structure, and the compensation well region has a doping concentration that is smaller than that of the first guard ring structure or the second guard ring structure.

11. The semiconductor structure of claim 9, wherein the second guard ring structure further comprises:
   a third guard ring well region located in the termination region of the silicon carbide layer and surrounding the at least one second guard ring well region, the third guard ring well region being not overlapping with the first guard ring structure, and a side edge of the third guard ring well region away from the unit region being aligned in the vertical direction with a side edge of the compensation well region that is away from the unit region.

12. The semiconductor structure of claim 1, wherein,
the first guard ring structure includes a plurality of first guard ring well regions separated from each other,
the second guard ring structure includes a plurality of second guard ring well regions separated from each other, and
the plurality of second guard ring well regions respectively overlap with the plurality of first guard ring well regions in the vertical direction.

13. The semiconductor structure of claim 12, wherein,
each of the plurality of first guard ring well regions is located within a coverage of a vertical projection of a corresponding second guard ring well region, and
a distance from a first side edge of a first guard ring well region to a second side edge of the corresponding second guard ring well region along a horizontal direction is in a range of 0-2 μm, wherein the first side edge and the second side edge are close to the unit region.

14. The semiconductor structure of claim 1, wherein the second guard ring structure is a single doped region, and the at least one first guard ring well region is located within a coverage of a vertical projection of the single doped region.

15. The semiconductor structure according to claim 14, wherein the single doped region extends into a region in the unit region of the silicon carbide layer, the region being below a transition well region that is in the unit region of the silicon carbide layer and that adjoins the termination region.

16. The semiconductor structure of claim 1, wherein,
the silicon carbide layer includes a first silicon carbide layer, and a second silicon carbide layer below the first silicon carbide layer,
the first guard ring structure is located in the first silicon carbide layer and adjoins a top surface of the first silicon carbide layer, and
the second guard ring structure is located in the second silicon carbide layer, and adjoins a top surface of the second silicon carbide layer.

17. A semiconductor structure comprising:
a substrate comprising a unit region and a termination region surrounding the unit region, wherein the substrate comprises a first silicon carbide layer and a second silicon carbide layer under the first silicon carbide layer;
a first guard ring structure in the termination region and in the first silicon carbide layer, the first guard ring structure adjoining a top surface of the first silicon carbide layer, and including at least one first guard ring well region;
a second guard ring structure in the termination region and in the second silicon carbide layer, the second guard ring structure including at least one second guard ring well region corresponding one-to-one to the at least one first guard ring well region; and
a third guard ring structure in the unit region and in the second silicon carbide layer.

18. The semiconductor structure of claim 17, further comprising:
a transition well region in the unit region and in the first silicon carbide layer, the transition well region adjoining the termination region and above the third guard ring structure.

19. The semiconductor structure of claim 17, wherein a distance from a top of the second guard ring structure to a bottom of the first guard ring structure in a vertical direction is in a range of 0-3 micrometer (μm).

20. A semiconductor structure comprising:
a substrate comprising a unit region and a termination region surrounding the unit region, wherein the substrate comprises a first silicon carbide layer and a second silicon carbide layer under the first silicon carbide layer;
a first guard ring structure in the termination region and in the first silicon carbide layer, the first guard ring structure adjoining a top surface of the first silicon carbide layer, and including at least one first guard ring well region;
a second guard ring structure in the termination region and in the second silicon carbide layer, the second guard ring structure including at least one second guard ring well region corresponding one-to-one to the at least one first guard ring well region;
a third guard ring well region in the termination region and in the second silicon carbide layer, the third guard ring well region surrounding the at least one second guard ring well region, with a depth about same as that of the at least one second guard ring well region; and
a compensation well region in the termination region and in the first silicon carbide layer, the compensation well region adjoining the top surface of the silicon carbide layer, a depth of the compensation well region being less than that of the first guard ring structure, and the first guard ring structure being within a coverage of the compensation well region.

* * * * *